(12) United States Patent
Kim et al.

(10) Patent No.: US 9,595,611 B2
(45) Date of Patent: Mar. 14, 2017

(54) FINFET WITH A SINGLE CONTACT TO MULTIPLE FINS BRIDGED TOGETHER TO FORM A SOURCE/DRAIN REGION OF THE TRANSISTOR

(71) Applicants: Seok-Hoon Kim, Hwaseong-si (KR); Bon-Young Koo, Suwon-si (KR); Nam-Kyu Kim, Yongin-si (KR); Woo-Bin Song, Hwaseong-si (KR); Byeong-Chan Lee, Yongin-si (KR); Su-Jin Jung, Hwaseong-si (KR)

(72) Inventors: Seok-Hoon Kim, Hwaseong-si (KR); Bon-Young Koo, Suwon-si (KR); Nam-Kyu Kim, Yongin-si (KR); Woo-Bin Song, Hwaseong-si (KR); Byeong-Chan Lee, Yongin-si (KR); Su-Jin Jung, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/262,712

(22) Filed: Apr. 26, 2014

(65) Prior Publication Data

US 2015/0035023 A1 Feb. 5, 2015

(30) Foreign Application Priority Data

Aug. 1, 2013 (KR) ........................ 10-2013-0091594

(51) Int. Cl.
| | |
|---|---|
| H01L 29/78 | (2006.01) |
| H01L 21/8234 | (2006.01) |
| H01L 29/66 | (2006.01) |
| H01L 27/12 | (2006.01) |

(52) U.S. Cl.
CPC .... *H01L 29/785* (2013.01); *H01L 21/823431* (2013.01); *H01L 27/1211* (2013.01); *H01L 29/66545* (2013.01)

(58) Field of Classification Search
CPC ......... H01L 29/66795; H01L 29/41791; H01L 29/7851; H01L 29/7853; H01L 27/1211; H01L 29/785
USPC .......................................................... 257/288
See application file for complete search history.

(56) References Cited

U.S. PATENT DOCUMENTS

| | | | |
|---|---|---|---|
| 7,425,500 | B2 | 9/2008 | Metz et al. |
| 7,554,165 | B2 | 6/2009 | Hokazono |
| 7,692,254 | B2 | 4/2010 | Anderson et al. |
| 7,898,041 | B2 | 3/2011 | Radosavljevic et al. |
| 7,910,994 | B2 | 3/2011 | Yu et al. |
| 7,915,693 | B2 | 3/2011 | Okano |
| 8,043,920 | B2 | 10/2011 | Chan et al. |
| 8,116,121 | B2 | 2/2012 | Kawasaki |

(Continued)

FOREIGN PATENT DOCUMENTS

KR 10-0853653 7/2008

*Primary Examiner* — Marcos D Pizarro
(74) *Attorney, Agent, or Firm* — Muir Patent Law, PLLC

(57) ABSTRACT

A semiconductor device may include first and second fins formed side by side on a substrate, a first elevated doped region formed on the first fin and having a first doping concentration of impurities, a second elevated doped region formed on the second fin, and a first bridge connecting the first elevated doped region and the second elevated doped region to each other. Methods of manufacturing such a semiconductor device are also disclosed.

20 Claims, 36 Drawing Sheets

(56) References Cited

U.S. PATENT DOCUMENTS

| | | |
|---|---|---|
| 8,211,761 B2 | 7/2012 | Tan et al. |
| 8,263,451 B2 | 9/2012 | Su et al. |
| 8,460,990 B2 | 6/2013 | Kim et al. |
| 8,623,728 B2 | 1/2014 | Chang et al. |
| 8,759,184 B2 | 6/2014 | Ho et al. |
| 8,796,093 B1 | 8/2014 | Cheng et al. |
| 9,318,578 B2 | 4/2016 | Basker et al. |
| 2006/0216880 A1 | 9/2006 | Suto |
| 2007/0148837 A1* | 6/2007 | Shah et al. .......... H01L 21/0332 438/164 |
| 2008/0111197 A1 | 5/2008 | Mikasa |
| 2011/0073952 A1 | 3/2011 | Kwok et al. |
| 2011/0079855 A1 | 4/2011 | Chan et al. |
| 2011/0298058 A1 | 12/2011 | Kawasaki et al. |
| 2014/0001520 A1 | 1/2014 | Glass et al. |
| 2014/0131776 A1 | 5/2014 | Ching et al. |
| 2014/0197458 A1 | 7/2014 | Ching et al. |
| 2014/0264279 A1* | 9/2014 | Cheng et al. ....... H01L 29/7853 257/27 |

* cited by examiner

US 9,595,611 B2

FINFET WITH A SINGLE CONTACT TO MULTIPLE FINS BRIDGED TOGETHER TO FORM A SOURCE/DRAIN REGION OF THE TRANSISTOR

CROSS-REFERENCE TO RELATED APPLICATION

This application claims priority from Korean Patent Application No. 10-2013-0091594 filed on Aug. 1, 2013 in the Korean Intellectual Property Office, and all the benefits accruing therefrom under 35 U.S.C. 119, the contents of which in its entirety are herein incorporated by reference.

BACKGROUND

1. Field of the Invention

The present invention relates to a semiconductor device, system and a method for fabricating the same.

2. Description of the Related Art

In order to improve operating characteristics of a semiconductor device, many attempts to reduce resistance are being made, such as reducing a contact resistance.

Contact resistance may be a function of a work function of silicide and a doping concentration. A Schottky barrier height (SBH) may be determined by the work function and the doping concentration which affects the contact resistance. In addition, a size of the contact area may affect the contact resistance.

SUMMARY

Semiconductor devices, systems and methods for manufacturing the same are disclosed. According to some embodiments, a semiconductor device may comprise a semiconductor substrate with a first semiconductor fin with a first protrusion and a second semiconductor fin with a second protrusion, the first semiconductor fin being adjacent the second semiconductor fin, the first and second semiconductor fins extending in a first direction; a gate electrode extending in a second direction and positioned over the first protrusion of the first semiconductor fin and over the second protrusion of the second semiconductor fin; a first source/drain adjacent the first protrusion and extending from the first semiconductor fin, an upper oblique surface of the first source/drain and a lower oblique surface of the first source/drain meeting at a first corner of the first source/drain; a second source/drain adjacent the second protrusion and extending from the second semiconductor fin, an upper oblique surface of the second source/drain and a lower oblique surface of the second source/drain meeting at a second corner of the second source/drain; and a semiconductor bridge extending between and contacting the first corner of the first source/drain and the second corner of the second source/drain.

The first and second source/drains may contact the first and second fins at a first height, and at the first height, the first fin and the second fin may be separated from each other by a first distance, and a minimum distance between the first source/drain and the second source/drain is between the first corner of the first source/drain and the second source/drain, the minimum distance being less than the first distance.

The pitch distance between the first fin and the second fin may be 48 nm or less.

The first and second semiconductor fins, the first and second source/drain regions and the semiconductor bridge may be crystalline.

An interlayer dielectric layer may be disposed about the first and second source/drains and below the semiconductor bridge; and a conductive contact may extend through the interlayer dielectric and contacting the semiconductor bridge at an upper surface of the semiconductor bridge.

The first and second source/drains may contact the first and second fins at a first height, and, at the first height, the first fin and the second fin may be separated from each other by a first distance, and, with respect to a cross section taken in a direction perpendicular to the first direction, the width of the conductive contact may be greater than the first distance.

With respect to a cross section taken in a direction perpendicular to the first direction, the first and second source/drains may have a diamond shape.

An air gap in the interlayer dielectric may exist at a location under the semiconductor bridge.

At least a portion of the semiconductor bridge may have a doping concentration higher than a doping concentration of the first and second source/drains.

The semiconductor bridge may be formed of SiGe.

The semiconductor bridge may have a doping concentration of a carrier impurity of $1*10^{20}$ atom/cc or greater.

The semiconductor bridge may have a concentration of germanium of $2.5*10^{22}$ atom/cc or greater.

The semiconductor bridge may include a first portion at the first corner and the second corner and a second portion on the first portion extending between and contacting the upper oblique surface of the first source/drain and the upper oblique surface of the second source/drain.

A doping concentration of the first portion of the semiconductor bridge may be higher than a doping concentration of the second portion of the semiconductor bridge.

The first and second portions of the semiconductor bridge may be formed of SiGe.

The first bridge may have a doping concentration of a carrier impurity of $1*10^{20}$ atom/cc or greater.

The first bridge may have a concentration of germanium of $2.5*10^{22}$ atom/cc or greater.

A doping concentration of the first portion of the bridge may be higher than a doping concentration of the first and second source/drains.

The second portion of the semiconductor bridge may have a top surface at least as high as top surfaces of the first and second source/drains.

The first portion of the semiconductor bridge may extend between and contact the first corner and the second corner and extends between and contacts the lower oblique surfaces of the first and second source/drains.

The lower oblique surface of the first source/drain may intersect the lower oblique surface of the second source/drain, and the semiconductor device may further comprise a capping layer on the lower oblique surfaces of the first and second drains, extending to the intersection of the lower oblique surfaces.

The upper oblique surface of the first source/drain may intersect the upper oblique surface of the second source/drain.

The first portion of the semiconductor bridge may be located at the intersection of the upper oblique surfaces off the first and second source drains.

The lower oblique surface of the first source/drain may intersect the lower oblique surface of the second source/drain, and the semiconductor device may further comprise a capping layer on the lower oblique surfaces of the first and second drains, extending to the intersection of the lower oblique surfaces.

The semiconductor device may further comprise a third semiconductor fin with a third protrusion and a fourth semiconductor fin with a fourth protrusion, the third semiconductor fin being adjacent the fourth semiconductor fin; a second gate electrode extending over the third protrusion of the third semiconductor fin and over the fourth protrusion of the fourth semiconductor fin; a third source/drain adjacent the third protrusion and extending from the third semiconductor fin, an upper oblique surface of the third source/drain and a lower oblique surface of the third source drain meeting at a third corner of the third source/drain; and a fourth source/drain adjacent the fourth protrusion and extending from the fourth semiconductor fin, an upper oblique surface of the fourth source/drain and a lower oblique surface of the fourth source drain meeting at a fourth corner of the fourth source/drain.

An interlayer dielectric layer may be disposed about the first, second, third and fourth source/drains and below the semiconductor bridge; and a first conductive contact may extend through the interlayer dielectric and contacting the semiconductor bridge at an upper surface of the semiconductor bridge.

The semiconductor device may also comprise a second conductive contact extending through the interlayer dielectric and contacting the third source/drain; and a third conductive contact extending through the interlayer dielectric and contacting the fourth source/drain.

A pitch distance between the first fin and the second fin may be 48 nm or less.

A pitch distance between the third fin and the fourth fin may be 68 nm or more.

A pitch distance between the third fin and the fourth fin may be 78 nm or more.

The first and second corner may contact each other.

The first semiconductor fin, the second semiconductor fin, the first source/drain and the second source drain may be located in a logic region of the semiconductor device, and the third semiconductor fin, the fourth semiconductor fin, the third source/drain and the fourth source/drain may be located in a memory region of the semiconductor device.

The memory region may be an SRAM region.

The memory region may not include any semiconductor bridges extending between source/drains of neighboring semiconductor fins.

In some embodiments, a semiconductor device comprises a semiconductor substrate with a first semiconductor fin with a first protrusion and a second semiconductor fin with a second protrusion, the first semiconductor fin being adjacent the second semiconductor fin, the first and second semiconductor fins extending in a first direction; a gate electrode extending in a second direction and positioned over the first protrusion of the first semiconductor fin and over the second protrusion of the second semiconductor fin; a first epitaxial seed layer adjacent the first protrusion on the first semiconductor fin; a first epitaxial source/drain adjacent the first protrusion and extending from the first epitaxial seed layer on first semiconductor fin, an upper oblique surface of the first epitaxial source/drain and a lower oblique surface of the first epitaxial source/drain meeting at a first corner of the first source/drain, the first source/drain having a diamond shaped cross section; a second epitaxial seed layer adjacent the second protrusion on the second semiconductor fin; a second epitaxial source/drain adjacent the second protrusion and extending from the second seed layer on the second semiconductor fin, an upper oblique surface of the second epitaxial source/drain and a lower oblique surface of the second epitaxial source/drain meeting at a second corner of the second epitaxial source/drain, the epitaxial second source/drain having a diamond shaped cross section; an epitaxial semiconductor bridge extending between and contacting the first corner of the first source/drain and the second corner of the second source/drain; and an epitaxial semiconductor capping layer formed on the semiconductor bridge, the lower and upper oblique surfaces of the first source/drain and the lower and upper oblique surfaces of the second source/drain.

The epitaxial semiconductor bridge, the first and second epitaxial source/drains and the first and second epitaxial seed layers may be formed of SiGe.

The epitaxial semiconductor capping layer may be formed of Si.

A concentration of a carrier impurity of at least a portion of the epitaxial semiconductor bridge may be greater than a concentration of a carrier impurity of the first and second source/drains.

The carrier impurity concentration of at least a portion of the epitaxial semiconductor bridge may be greater than $1*10^{20}$ atom/cc.

A concentration of Ge in at least a portion of the epitaxial semiconductor bridge may be greater than a concentration of Ge in the first and second source/drain regions which is greater than a concentration of Ge in the first and second epitaxial seed layers.

Methods for manufacturing the same are also disclosed. Systems including the same are also disclosed.

BRIEF DESCRIPTION OF THE DRAWINGS

The above and other features and advantages of the present invention will become more apparent by describing in detail preferred embodiments thereof with reference to the attached drawings in which:

FIGS. 18 to 28, including

FIGS. 29 to 37A and 37B are cross-sectional views sequentially illustrating intermediate stages in a method of fabricating a semiconductor device according to embodiments of the present invention;

DETAILED DESCRIPTION OF THE EMBODIMENTS

Figure 1:
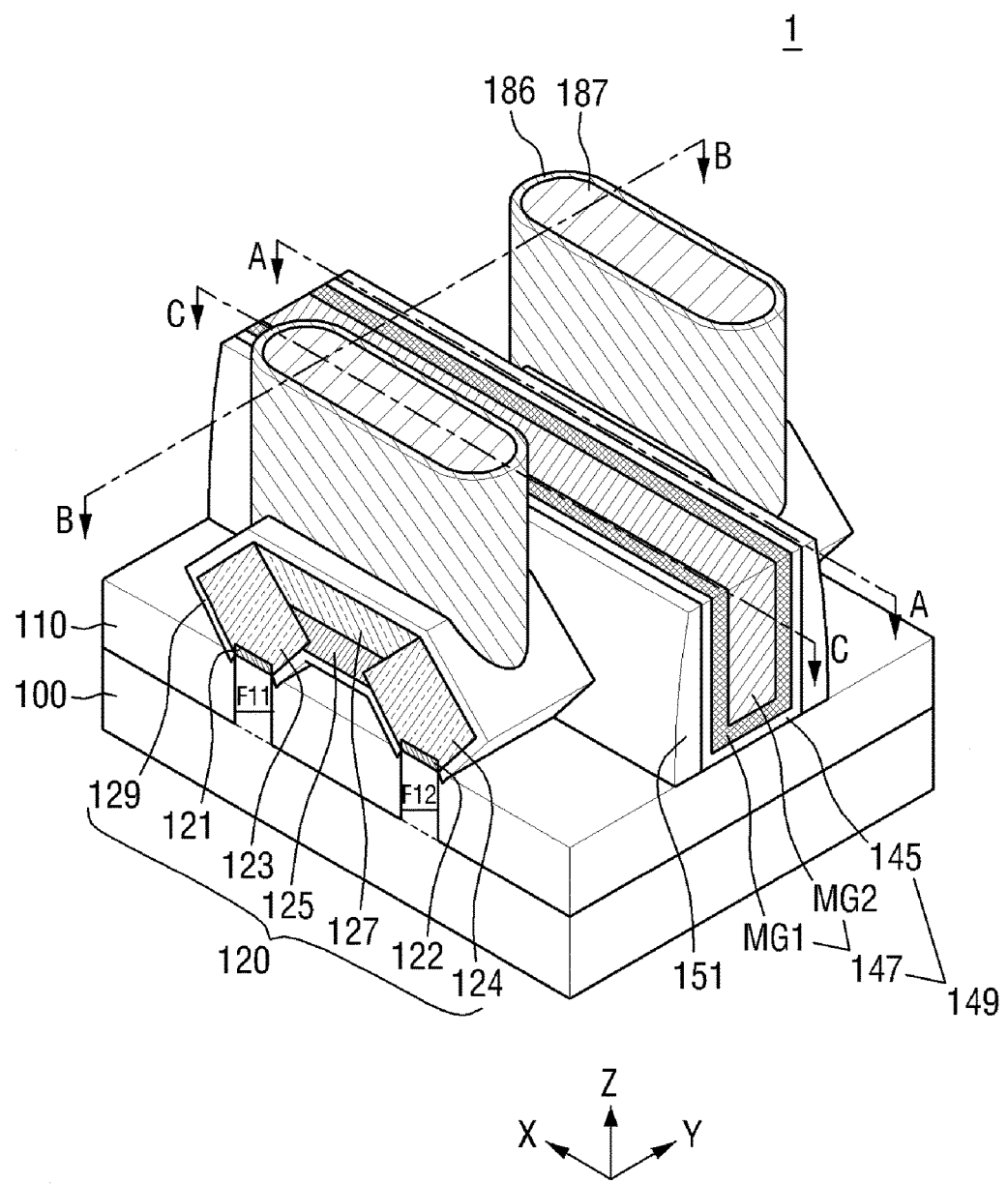
FIG. 1 a perspective view of a semiconductor device according to a first embodiment of the present invention.

Advantages and features of the present inventive concept and methods of accomplishing the same may be understood more readily by reference to the following detailed description of preferred embodiments and the accompanying drawings. The present invention may, however, be embodied in many different forms and should not be construed as being limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the thickness of layers and regions may be exaggerated for clarity. Like numbers refer to like elements throughout. Devices and methods of forming devices according to various embodiments described herein may be embodied in microelectronic devices such as integrated circuits, wherein a plurality of devices according to various embodiments described herein are integrated in the same microelectronic device. Accordingly, cross-sectional view(s) illustrated herein (even if illustrated in a single direction or orientation) may exist in different directions or orientations (which need not be orthogonal or related as set forth in the described embodiments) in the microelectronic device. Thus, a plan view of the microelectronic device that embodies devices according to various embodiments described herein may include a plurality of the devices in an array and/or in a two-dimensional pattern having orientations that may be based on the functionality or other design considerations of the microelectronic device. The cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and/or transistor structures (and/or memory cell structures, gate structures, etc., as appropriate to the case) that may have a variety of orientations.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed or claimed below could be termed or claimed as a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures may be schematic in nature and their shapes may not illustrate the actual shape of a region of a device. Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a semiconductor device according to a first embodiment of the present invention will be described with reference to FIGS. 1 to 7.

Figure 2:
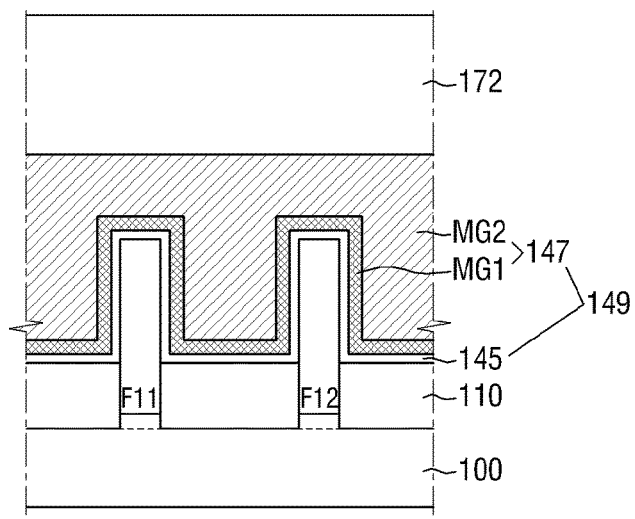
FIG. 2 is a cross-sectional view taken along the line A-A of FIG. 1.
Figure 3:
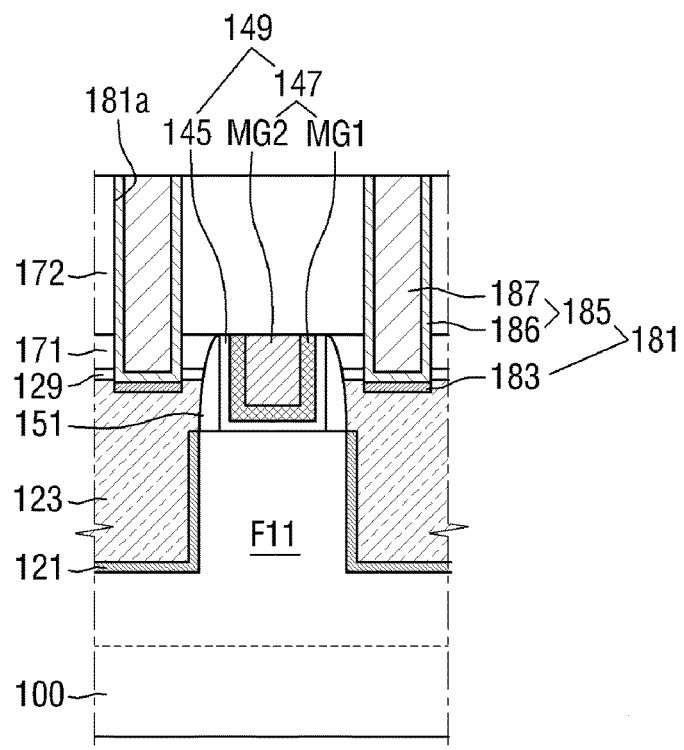
FIG. 3 is a cross-sectional view taken along the line B-B of FIG. 1.
Figure 4:
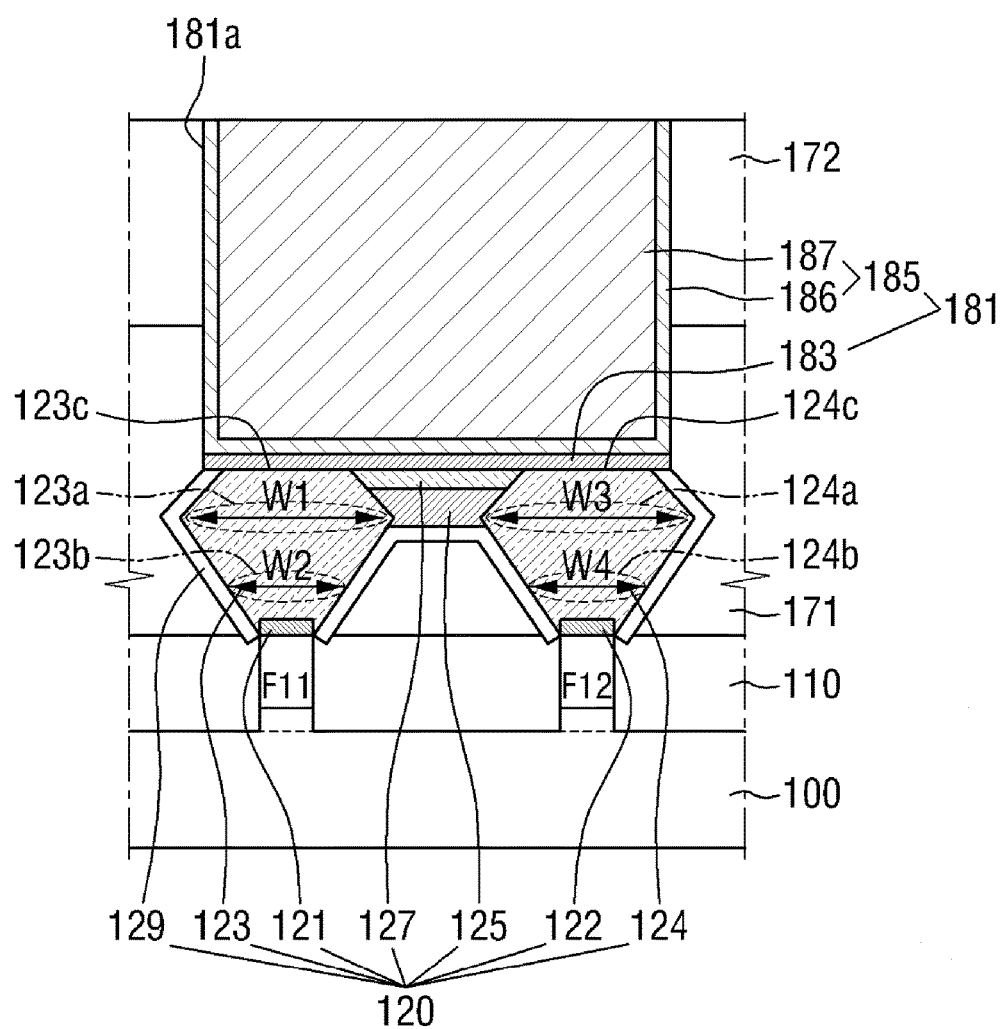
FIGS. 4 and 5A are cross-sectional views taken along the line C-C of FIG. 1.
Figure 5A:
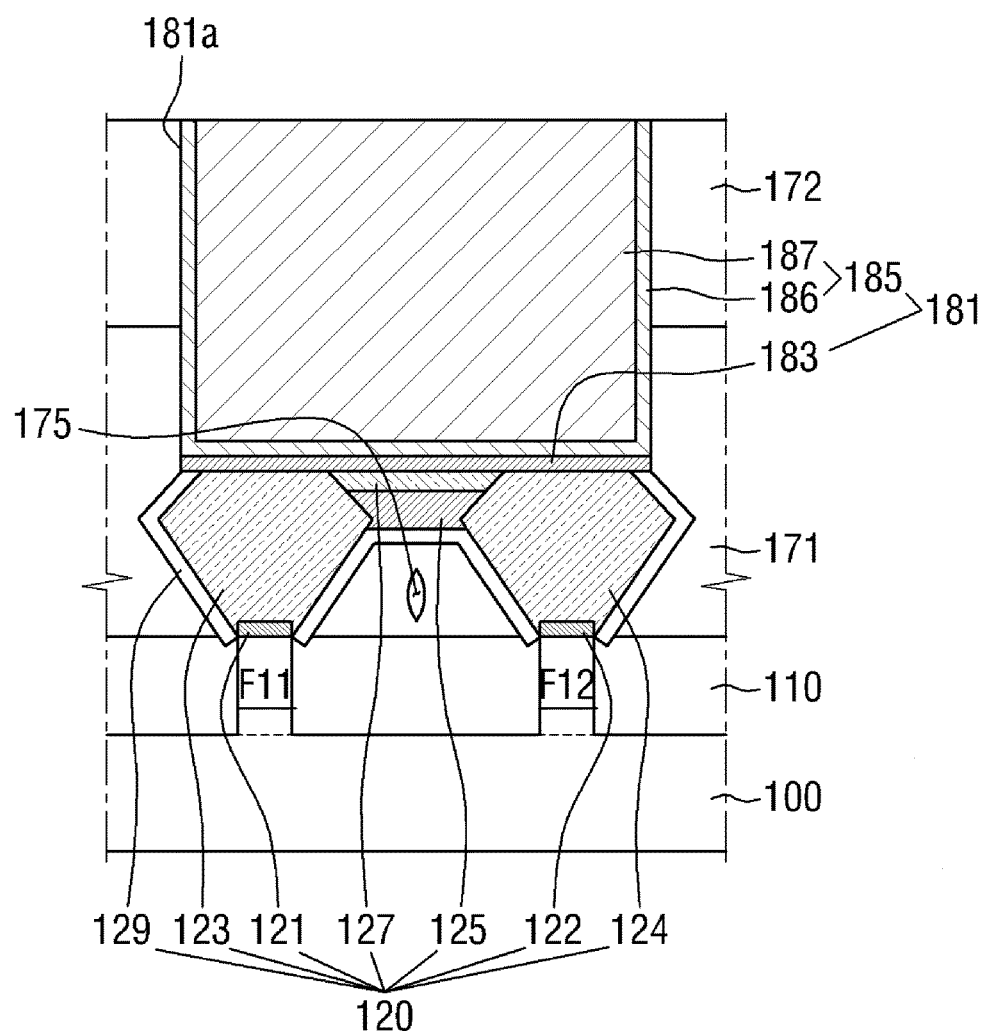
Figure 6:
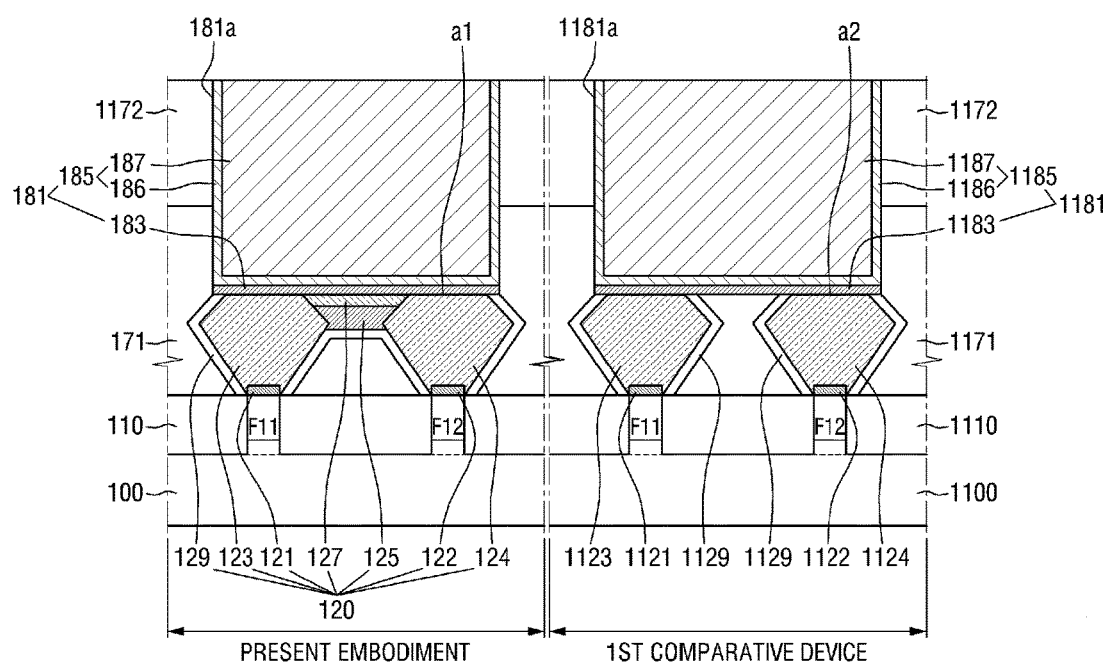
FIGS. 6 and 7 illustrate effects of the semiconductor device shown in FIG. 1.
Figure 7:
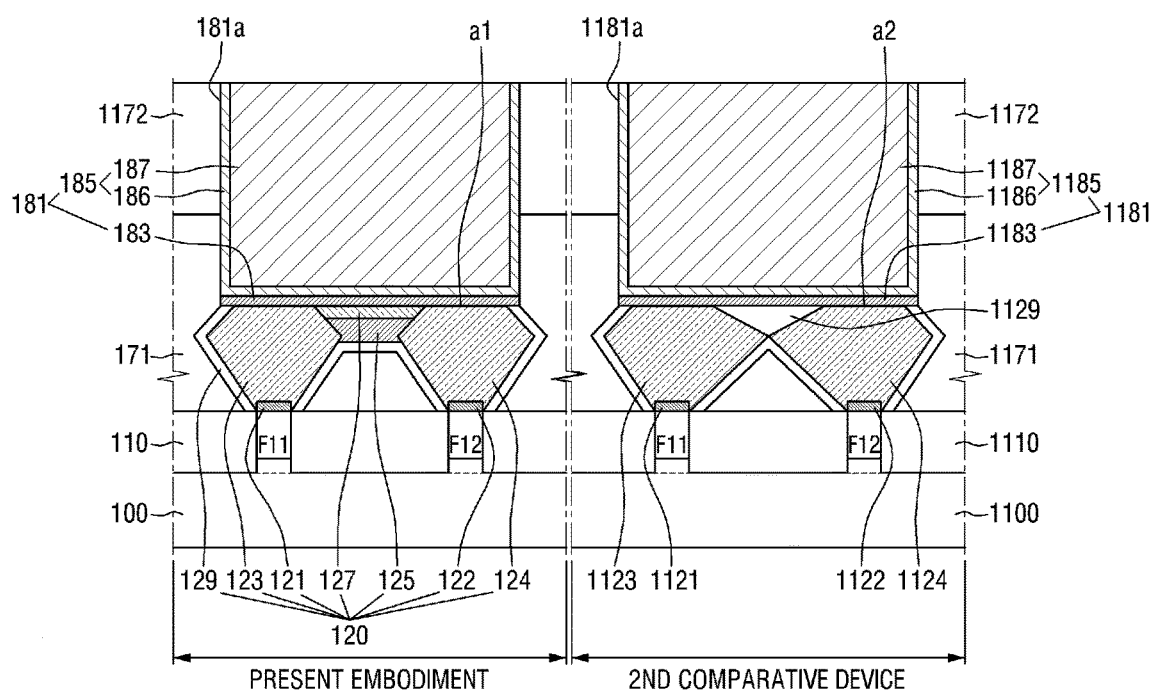

FIG. 1 a perspective view of a semiconductor device according to a first embodiment of the present invention, FIG. 2 is a cross-sectional view taken along the line A-A of FIG. 1, FIG. 3 is a cross-sectional view taken along the line B-B of FIG. 1, and FIGS. 4 and 5A are cross-sectional views taken along the line C-C of FIG. 1. For brevity, a first interlayer dielectric layer 171 and a second interlayer dielectric layer 172 are not shown in FIG. 1. FIGS. 6 and 7 illustrate effects of the semiconductor device shown in FIG. 1.

Referring to FIGS. 1 to 4, the semiconductor device 1 according to the first embodiment of the present invention may include a substrate 100, a first fin F11, a second fin F12, an isolation layer 110, a first gate structure 149, a first source/drain 120, a first contact 181, a first interlayer dielectric layer 171 and a second interlayer dielectric layer 172.

In detail, the substrate 100 may be made of one or more semiconductor materials selected from the group consisting of, for example, Si, Ge, SiGe, GaP, GaAs, SiC, SiGeC, InAs and InP. The substrate 100 may be monolithic crystalline wafer. Alternatively, the substrate 10 may be a silicon on insulator (SOI) substrate or other semiconductor on an insulator. The first fin F11 and the second fin F12 may extend lengthwise in a second direction Y1. In detail, the first fin F11 and the second fin F12 may have long sides and short sides and may be positioned to have their long sides face and to be adjacent to each other. In FIG. 1, the fins extend lengthwise in the second direction Y1, but aspects of the present invention are not limited thereto. For example, the first fin F11 and the second fin F12 may extend lengthwise in the first direction X1.

The first fin F11 and the second fin F12 may be portions of the substrate 100, such as being formed by etching a semiconductor wafer substrate (e.g., crystalline silicon). The Fins F11 and F12 may be an epitaxial layer selectively grown from the substrate 100 (e.g., formed by providing a patterned layer having openings exposing a semiconductor wafer substrate and epitaxially growing the fins F11 and F12 within the openings). The first and second fins F11 and F12 may include, for example, Si or SiGe. The isolation layer 110 may be formed on the substrate 100 and may cover lateral surfaces of the first fin F11 and the second fin F12.

The first gate structure 149 may include a first gate insulation layer 145 and a first gate electrode 147 and may be formed on the first fin F11 and the second fin F12 to cross the first fin F11 and the second fin F12. The first gate structure 149 may extend in the first direction X1. The first gate structure 149 may be formed on opposite side surfaces and a top surface of each of fins F11 and F12.

The first gate electrode 147 may include metal layers MG1 and MG2. As shown, the first gate electrode 147 may include two or more metal layers MG1 and MG2 stacked one on another. The first metal layer MG1 may control a work function, and the second metal layer MG2 may fill a space defined by the first metal layer MG1. For example, the first metal layer MG1 may include at least one of TiN, TaN, TiC, and TaC. In addition, the second metal layer MG2 may include W or Al. Further, the first gate electrode 147 may be made of a conductive or doped semiconductor, such as doped Si or SiGe, instead of a metal. The first gate electrode 147 may be formed by, for example, a replacement process, but aspects of the present invention are not limited thereto.

The first gate insulation layer 145 may be formed between the first fin F11 and the second fin F12 and the first gate electrode 147. As shown in FIG. 2, the first gate insulation layer 145 may be formed on a top surface and upper portions of lateral (sidewall) surfaces of the first fin F11 and on a top surface and upper portions of lateral (sidewall) surfaces of the second fin F12. In addition, the first gate insulation layer 145 may be disposed between the first gate electrode 147 and the isolation layer 110. The first gate insulation layer 145 may include a high-k material having a higher dielectric constant than a silicon oxide film. For example, the first gate insulation layer 145 may include $HfO_2$, $ZrO_2$, $LaO$, $Al_2O_3$ or $Ta_2O_5$. The high-k dielectric preferably may have a dielectric constant of 6 or greater. Alternatively, the high-k dielectric may have a dielectric constant of 8 or greater, larger than 10. A spacer 151 may be formed on sidewalls of the first gate structure 149 and may include at least one of a nitride film and an oxynitride film.

Source/drains (S/D) may be formed on both sides of the first gate structure 149. The first source/drain 120 may be formed on the first fin F11 and the second fin F12. The first source/drain 120 may include a first elevated doped region 123, a second elevated doped region 124, a first bridge 125, and a second bridge 127. A second source/drain 120 may be formed on an opposite side of the gate structure 149 with the same structure as the first source/drain 149 and discussion herein of source/drain structure may be implemented in both first and second source/drains 120.

The first elevated doped region 123 may be formed on the first fin F11 and the second elevated doped region 124 may be formed on the second fin F12. Top surfaces of the first and second elevated doped regions 123 and 124 may be higher than a bottom surface of the first interlayer dielectric layer 171. The first elevated doped region 123 and the second elevated doped region 124 may have various shapes. For example, the first elevated doped region 123 and the second elevated doped region 124 may have a cross section in the shape of a pentagon or hexagon, or have a rounded cross section, such as including a segment of a circle. As used in this disclosure, a diamond shape may include a pentagon or hexagon shape (e.g., a top and/or bottom corner of a four sided diamond may not be formed and instead a flat surface may exist in place of this corner(s).)

The first elevated doped region 123 and the second elevated doped region 124 with a diamond shaped cross section are exemplified in FIGS. 1, 4 and 5A.

As shown in FIG. 4, the first elevated doped region 123 may include a first region 123*a* and a second region 123*b*. The second region 123*b* is closer to the first fin F11 than the first region 123*a*. A first width W1 of the first region 123*a* may be greater than a second width W2 of the second region 123*b*. Likewise, the second elevated doped region 124 may include a third region 124*a* and a fourth region 124*b*. The fourth region 124*b* is closer to the second fin F12 than the third region 124*a*. A third width W3 of the third region 124*a* may be greater than a fourth width W4 of the fourth region 124*b*. Therefore, a distance between the first region 123*a* and the third region 124*a* may be shorter than a distance between the second region 123*b* and the fourth region 124*b*, and the second region 123*b* and the fourth region 124*b* may be spaced apart from each other. The distance between fins F11 and F12 and thus the distance between the first region 123*a* and the third region 124*a* (e.g., between adjacent corners of the elevated doped regions 123 and 124) may be less than 48 nm.

A first bridge 125 may be formed between the first elevated doped region 123 and the second elevated doped region 124. The first bridge 125 may make contact with the first elevated doped region 123 and the second elevated doped region 124 and may connect the first elevated doped region 123 and the second elevated doped region 124 to each other. In detail, the first bridge 125 may connect the first region 123*a* of the first elevated doped region 123 and the third region 124*a* of the second elevated doped region 124 to each other.

A cross-section of the first bridge 125 taken along the line C-C in FIG. 1 may have a shape of, for example, an inverted trapezoid. In addition, a cross-section of the first bridge 125 making contact with the first elevated doped region 123 or the second elevated doped region 124 may have a shape of, for example, sigma ($\Sigma$), but aspects of the present invention are not limited thereto.

The second bridge 127 may be formed on the first bridge 125. The second bridge 127 may connect the first elevated doped region 123 and the second elevated doped region 124 to each other. In detail, the second bridge 127 may fill a space between the first elevated doped region 123 and the second elevated doped region 124 formed on the first bridge 125. The second bridge 127 may connect a top surface 123*c* of the first elevated doped region 123 to a top surface 125*c* of the second elevated doped region 124. The top surface 123*c* of the first elevated doped region 123, the top surface 125*c* of the second elevated doped region 124 and a top surface of the second bridge 127 may be connected to each other.

The first capping layer 129 may be formed on sidewalls of the first elevated doped region 123 and sidewalls of the second elevated doped region 124. In addition, the first capping layer 129 may be formed on a bottom surface of the first bridge 125. In this example, the first capping layer 129 is not formed on a top surface of the first bridge 125. The first capping layer 129 may be epitaxially grown and may comprise intrinsic semiconductor (e.g., intrinsic Si) or semiconductor with low doping levels.

A first seed layer 121 may be formed between the first fin F11 and the first elevated doped region 123, and a second seed layer 122 may be formed between the second fin F12 and the second elevated doped region 124. The first and second seed layers 121 and 122 may serve as seeds necessary for epitaxially growing the first and second elevated doped regions 123 and 124.

The first source/drain 120 may include silicon (Si). The first capping layer 129 may be formed of a semiconductor and may or may not include impurities. In a case where the impurity is not included in the first capping layer 129, an etch rate of the first capping layer 129 may be reduced, compared to a case where the impurity is included in the first capping layer 129. Therefore, the first capping layer 129 may adjust etch rates of the first and second elevated doped regions 123 and 124 when forming the first contact 181. As an amount of the impurity contained is increased, the etch rate is increased.

The first and second seed layers 121 and 122, the first elevated doped region 123, the second elevated doped region 124, the first bridge 125 and the second bridge 127 may include impurities, which may be different concentrations. The first and second elevated doped regions 123 and 124 may have a first doping concentration of impurities, the first bridge 125 may have a second doping concentration of impurities, the second bridge 127 may have a third doping concentration of impurities, and the first and second seed layers 121 and 122 may have a fourth doping concentration of impurities. These doping concentrations may comprise a doping concentration profile that differs in concentration in relation to a location within the relevant element, where an average of such concentration profile comprises a doping concentration value.

The second doping concentration may be different from the first doping concentration and may be higher than the first doping concentration. That is to say, the first bridge 125 may include a larger doping concentration of impurities than the first and second elevated doped regions 123 and 124. In addition, the second doping concentration may be higher than the third doping concentration or the fourth doping concentration.

The third doping concentration and the first doping concentration may be equal to each other. Here, the term 'equal' is used to mean 'completely equal' or to encompass 'a slight difference within a margin of processing error'. The fourth doping concentration may be equal to or smaller than the first doping concentration.

The first and second doped regions 123 and 124 and the second bridge 127 may have an inverted U shape cross section. The portion of the first source/drain 120 including the first doping concentration may make contact with the first contact 181 on a top surface of the inverted U shape (that is, top surfaces of the first and second doped regions 123 and 124 and the second bridge 127 may make contact with first contact 181) and may electrically connect the first fin F11 and the second fin F12 to each other. The first bridge 125 is disposed in a concave portion of the U shape, that is, between the substrate 100 and the second bridge 127. The first bridge 125 is spaced apart from the substrate 100 and makes contact with the portion of the first source/drain 120 including the first doping concentration of impurities.

The impurities may include several types of impurities. For example, the impurities may include a first impurity of germanium (Ge) and a second impurity of boron (B), phosphorus (P) or arsenic (As), but aspects of the present invention are not limited thereto. The second impurity may be a carrier impurity. As used in this disclosure, a carrier impurity refers to impurities adding charge carriers (e.g., holes or electrons) with respect to an intrinsic semiconductor. In the impurities, the first impurity may control SBH of the first source/drain 120. As the amount of the first impurity is increased, the SBH may be reduced. In addition, the first impurity is a material having a greater lattice constant than Si and may improve the mobility of carriers of a channel region by applying compressive stress to the first fin F11 and the second fin F12. In the impurities, the second impurity may control resistance of the first source/drain 120. As the amount of the second impurity is increased, the resistance of the second impurity may be reduced.

For example, the second doping concentration of the first impurity is greater than or equal to $2.5*10^{22}$ atom/cc (atoms per cubic centimeter) and the second doping concentration of the second impurity is greater than or equal to $1*10^{20}$ atom/cc, but aspects of the present invention are not limited thereto. In the example embodiments described herein, the epitaxially grown semiconductor may be SiGe or Si doped with Ge as the first impurity; the first and third doping concentrations of the first impurity may result in SiGe with a percentage of Ge approximately between 44% and 55%; the second doping concentration of the first impurity may result in SiGe with a percentage of Ge greater than 55%; and the fourth doping concentration of the first impurity may result in SiGe with a percentage of Ge between 10% and 30%.

The first contact 181 may be formed on the second bridge 127. The first contact 181 may make contact with the second bridge 127 and may also make contact with the first elevated doped region 123 and the second elevated doped region 124. The top surfaces of the first and second elevated doped regions 123 and 124 and the top surface of the second bridge 127 may make contact with the first contact 181.

The first contact 181 may electrically connect a wire to the first source/drain 120 and may include a silicide layer 183 and a conductive layer 185. The silicide layer 183, formed on a bottom surface of the first contact 181, may make contact with the first elevated doped region 123, the second elevated doped region 124 and the second bridge 127, and the conductive layer 185 may be formed on the silicide layer 183.

The conductive layer 185 may include a first conductive layer 186 and a second conductive layer 187. The first conductive layer 186 may be conformally formed on the silicide layer 183 along the sidewalls and bottom surface of the contact hole 181a, and the second conductive layer 187 may be formed to fill the remainder of the contact hole 181a.

The silicide layer 183 may include, for example, a conductive material, such as Pt, Ni, or Co, but aspects of the present invention are not limited thereto.

The conductive layer 185 may include a conductive material. For example, the first conductive layer 186 may include Ti or TiN and the second conductive layer 187 may include W, Al or Cu, but aspects of the present invention are not limited thereto.

The first interlayer dielectric layer 171 and the second interlayer dielectric layer 172 are sequentially formed on the isolation layer 110. The first interlayer dielectric layer 171 may cover the first capping layer 129 and portions of the sidewalls of the first contact 181. The second interlayer dielectric layer 172 may cover remaining portions of the sidewalls of the first contact 181.

As shown in FIG. 3, a top surface of the first interlayer dielectric layer 171 may be on the same level with a top surface of the first gate electrode 147. The top surfaces of the first interlayer dielectric layer 171 and the first gate electrode 147 may be on the same level with each other due to planarization (e.g., a CMP process) of the first interlayer dielectric layer 171 and the first gate electrode 147. The second interlayer dielectric layer 172 may be formed to cover the first gate electrode 147. The first interlayer dielectric layer 171 and the second interlayer dielectric layer 172 may include at least one of an oxide film, a nitride film and an oxynitride film.

The first interlayer dielectric layer 171 may fill a space between the second region 123b and the fourth region 124b. However, since the first bridge 125 is formed in a space between the first region 123a and the third region 124a, the first interlayer dielectric layer 171 may not completely fill the space between the second region 123b and the fourth region 124b. In this case, as shown in FIG. 5A, a gap 175 may be disposed between the second region 123b and the fourth region 124b. Even if the gap 175 is disposed between the substrate 100 and the first bridge 125, performance of the semiconductor device 1 according to the first embodiment of the present invention may not be affected. Gap 175 may be an air gap.

Figure 5B:
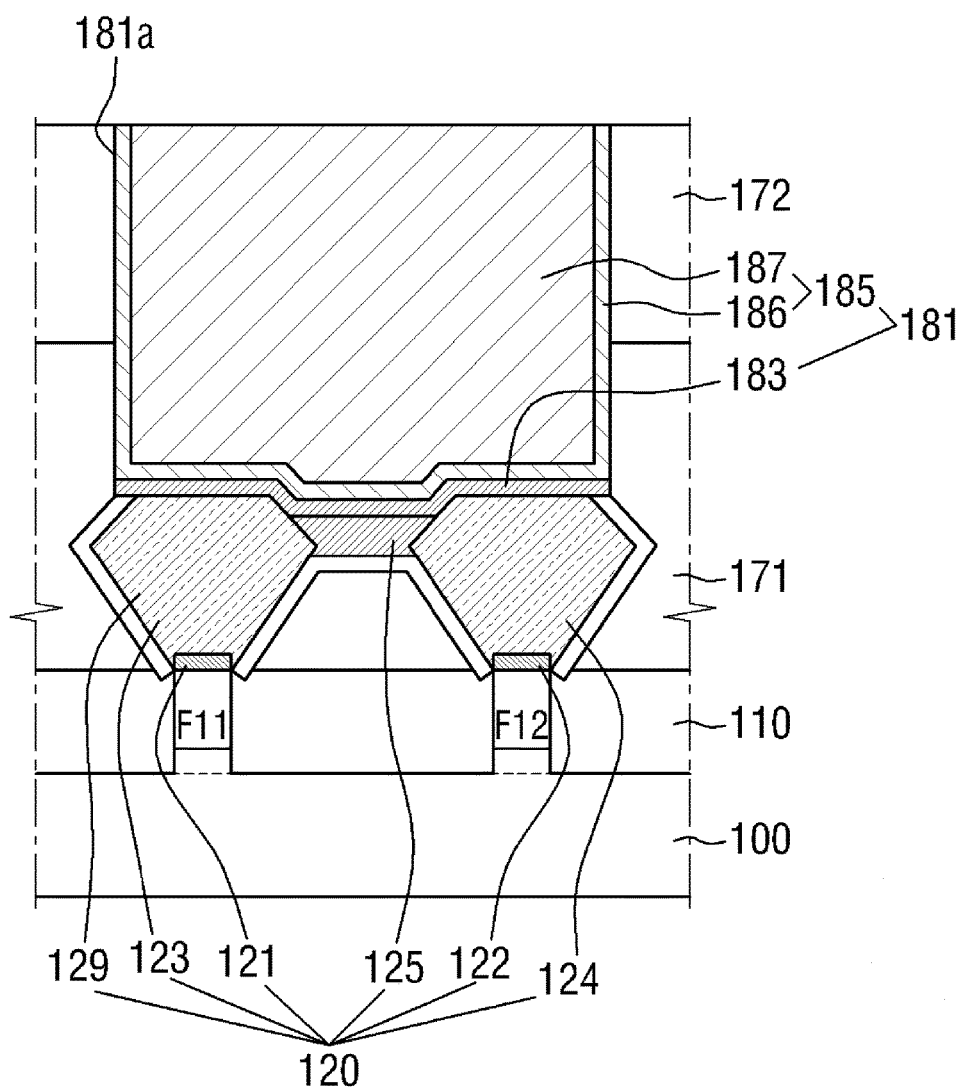
FIGS. 5B and 5C illustrate alternative structure as compared to the structure of FIG. 5A.
Figure 5C:
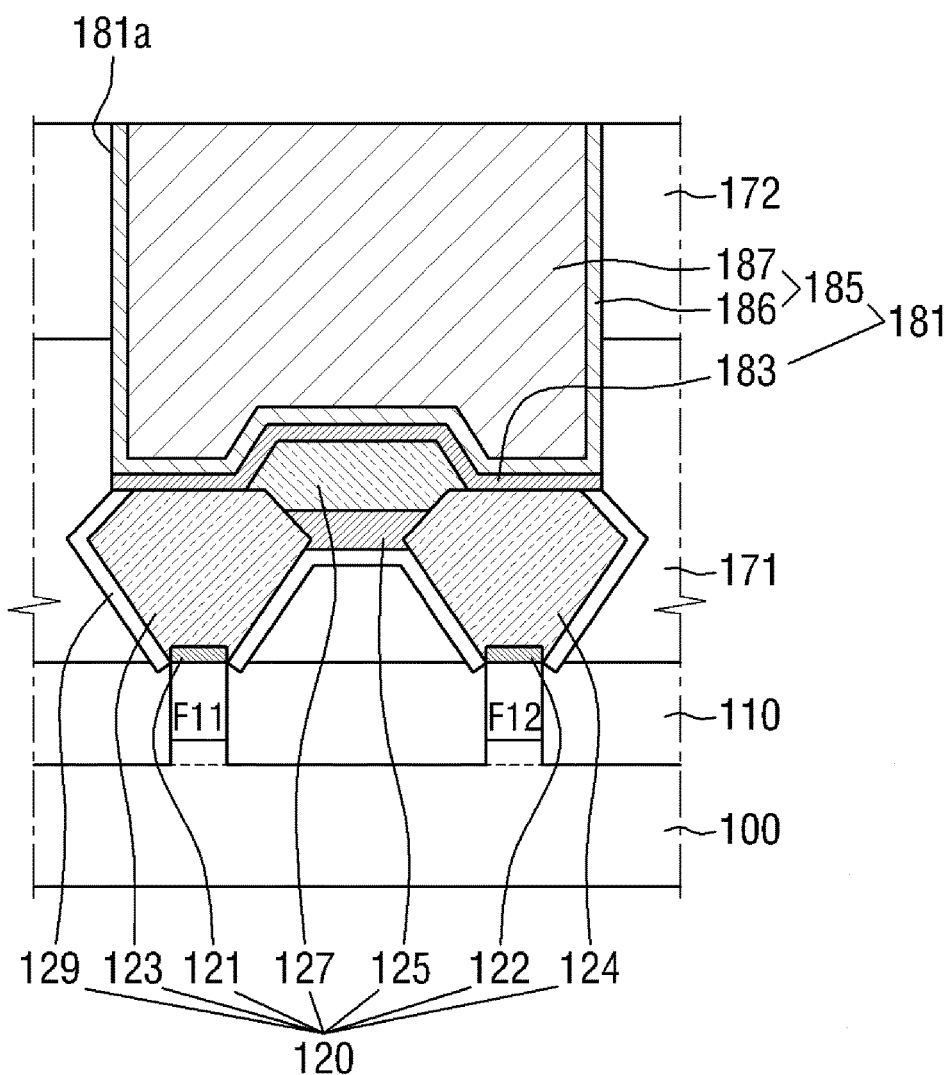

In alternative embodiments, the second bridge 127 may not be formed and the first contact 181 may contact the upper surface of the first bridge 125. Such an example is shown in FIG. 5B. In another alternative embodiment, the second bridge 127 may be formed to extend above top surfaces of elevated doped regions 123 and 124. Such an example is shown in FIG. 5C. In an alternative embodiment, the first bridge may be formed to extend above a top surface of elevated doped regions 123 and 124 (e.g., a first bridge may replace the combination of the first and second bridges 125, 127 in FIG. 5C). Use of the second bridge may or may not be used in this last alternative. Such alternatives discussed here with respect to FIGS. 5A, 5B and 5C are contemplated as possible implementations for all embodiments described herein.

Referring to FIG. 6, in the semiconductor device 1 according to the first embodiment of the present invention (shown in the left of FIG. 6), the first contact 181 may make contact with not only the first and second elevated doped regions 123 and 124 but also the second bridge 127. Since the first contact 181 makes contact with the second bridge 127, a contact area between the first contact 181 and the first source/drain 120 is relatively large, so that contact resistance therebetween may be reduced. Operating characteristics of the semiconductor device 1 according to the first embodiment of the present invention may be improved.

Like the first and second elevated doped regions 123 and 124, the second bridge 127 includes impurities, so that current may flow therethrough.

Meanwhile, in a first comparative device (shown in the right of FIG. 6), a contact 1181 may make contact with a first elevated doped region 1123 and a second elevated doped region 1124. Since a bridge is not formed between the first elevated doped region 1123 and the second elevated doped region 1124, there is no additional portion making contact with the contact 1181. In other words, in the semiconductor device 1 according to the first embodiment of the present invention, an area a1 of the first source/drain 120 (an upper portion of the upside down U-shaped source/drain) making contact with the first contact 181 is larger than an area a2 of the source/drain (the first and second elevated doped regions 1123 and 1124) making contact with the contact 1181 of the first comparative device. Therefore, the first comparative device has higher contact resistance than the semiconductor device 1 according to the first embodiment of the present invention.

As shown in FIG. 7, in a second comparative device (shown in the right of FIG. 7), a first elevated doped region 1123 and a second elevated doped region 1124 may make contact with each other. In this case, a capping layer 1129 may fill a space between the first elevated doped region 1123 and the second elevated doped region 1124, a contact 1181 may make contact with the capping layer 1129 between the first elevated doped region 1123 and the second elevated doped region 1124. Since the capping layer 1129 constitutes a portion of the source/drain, the contact 1181 may make contact with the source/drain in a wider area than the first comparative device. However, since the capping layer 1129 does not include impurities, current may not flow through the capping layer 1129. The current flows through only the first and second elevated doped regions 1123 and 1124. Eventually, in the second comparative device, the first and second elevated doped regions 1123 and 1124 may have current flowing therethrough due the impurities included therein, and may have an H shape between the fins F11 and F12 and the contact 1181. However, even if the contact 1181 makes contact with the capping layer 1129 between the first and second elevated doped regions 1123 and 1124, current does not flow through the capping layer 1129, so that the second comparative device has a high contact resistance, like the first comparative device.

Hereinafter, a semiconductor device according to a second embodiment of the present invention will be described with reference to FIGS. 8 and 9.

Figure 8:
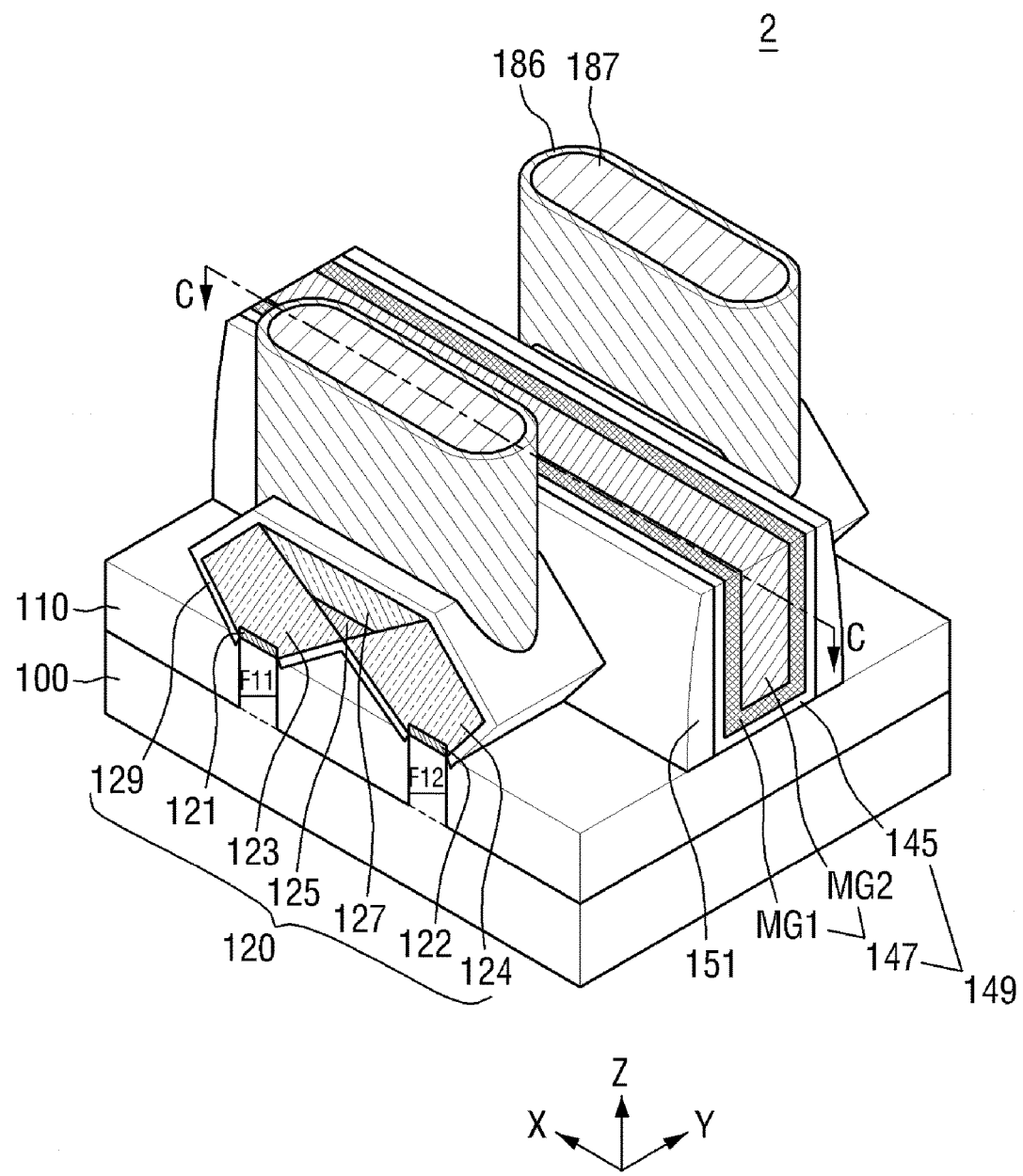
FIG. 8 is a perspective view of a semiconductor device according to a second embodiment of the present invention.
Figure 9:
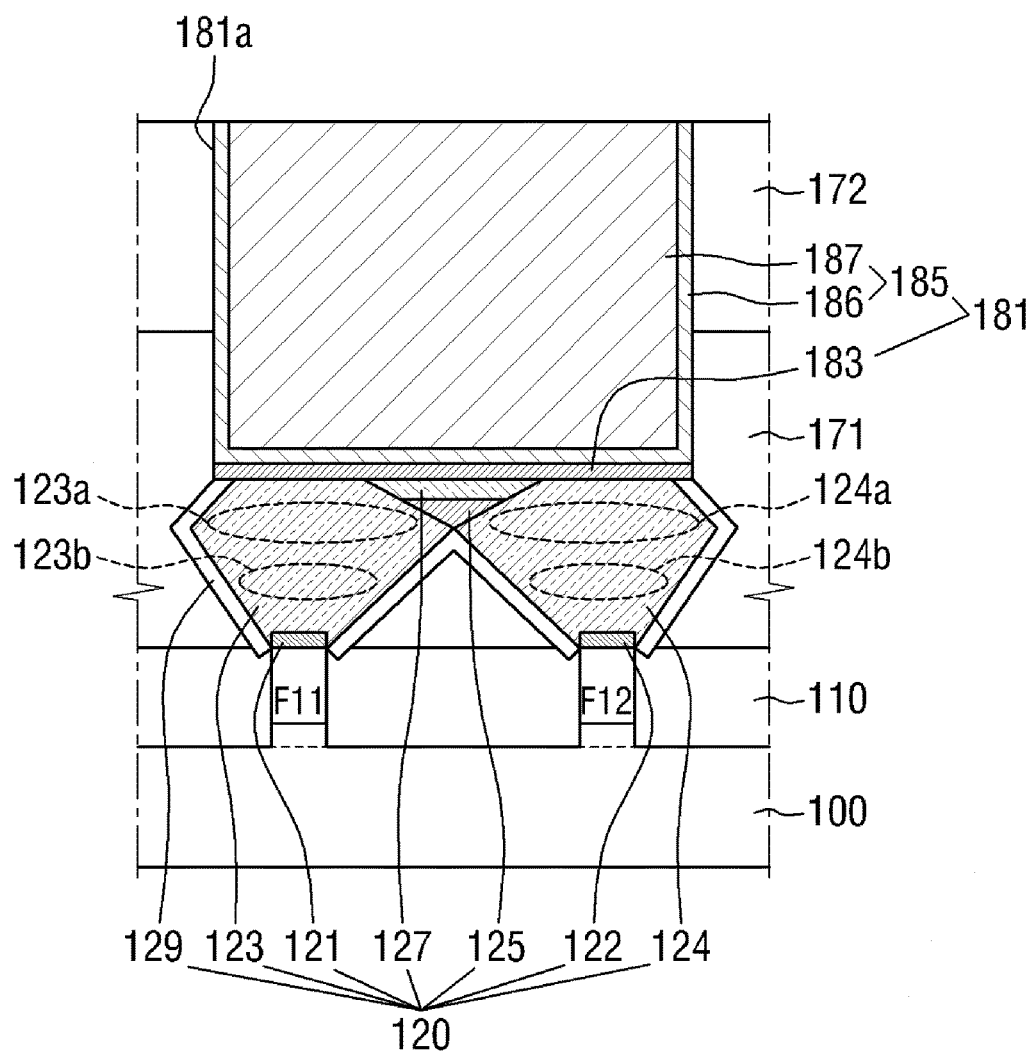
FIG. 9 is a cross-sectional view of the semiconductor device, taken along the line C-C of FIG. 8.

FIG. 8 is a perspective view of a semiconductor device according to a second embodiment of the present invention, and FIG. 9 is a cross-sectional view of the semiconductor device, taken along the line C-C of FIG. 8. For ease of illustration, first and second interlayer dielectric layers 171 and 172 are not illustrated in FIG. 8. The following description will focus on differences between the present embodiment and the previous embodiment shown in FIGS. 1 to 5A. Description of certain shared features will be omitted.

Referring to FIGS. 8 and 9, in the semiconductor device 2 according to the second embodiment of the present invention, the first elevated doped region 123 and the second elevated doped region 124 may make contact with each other. The first region 123a and the third region 124a shown in FIG. 9 may be connected to each other, and the second region 123b and the fourth region 124b may be spaced apart from each other.

The first bridge 125 may be formed between the first elevated doped region 123 and the second elevated doped region 124 and may make contact with the first and second elevated doped regions 123 and 124. The first bridge 125 may be formed on the first region 123a and the third region 124a shown in FIG. 4. Here, the first bridge 125 may have a cross sectional shape of an inverted triangle.

The second bridge 127 may be formed on the first bridge 125 and may fill a space between the first and second elevated doped regions 123 and 124. The first contact 181 may make contact with the first elevated doped region 123, the second elevated doped region 124 and the second bridge 127. The second bridge 127 may have a cross sectional shape of an inverted pyramid.

Next, a semiconductor device according to a third embodiment of the present invention will be described with reference to FIG. 10.

Figure 10:
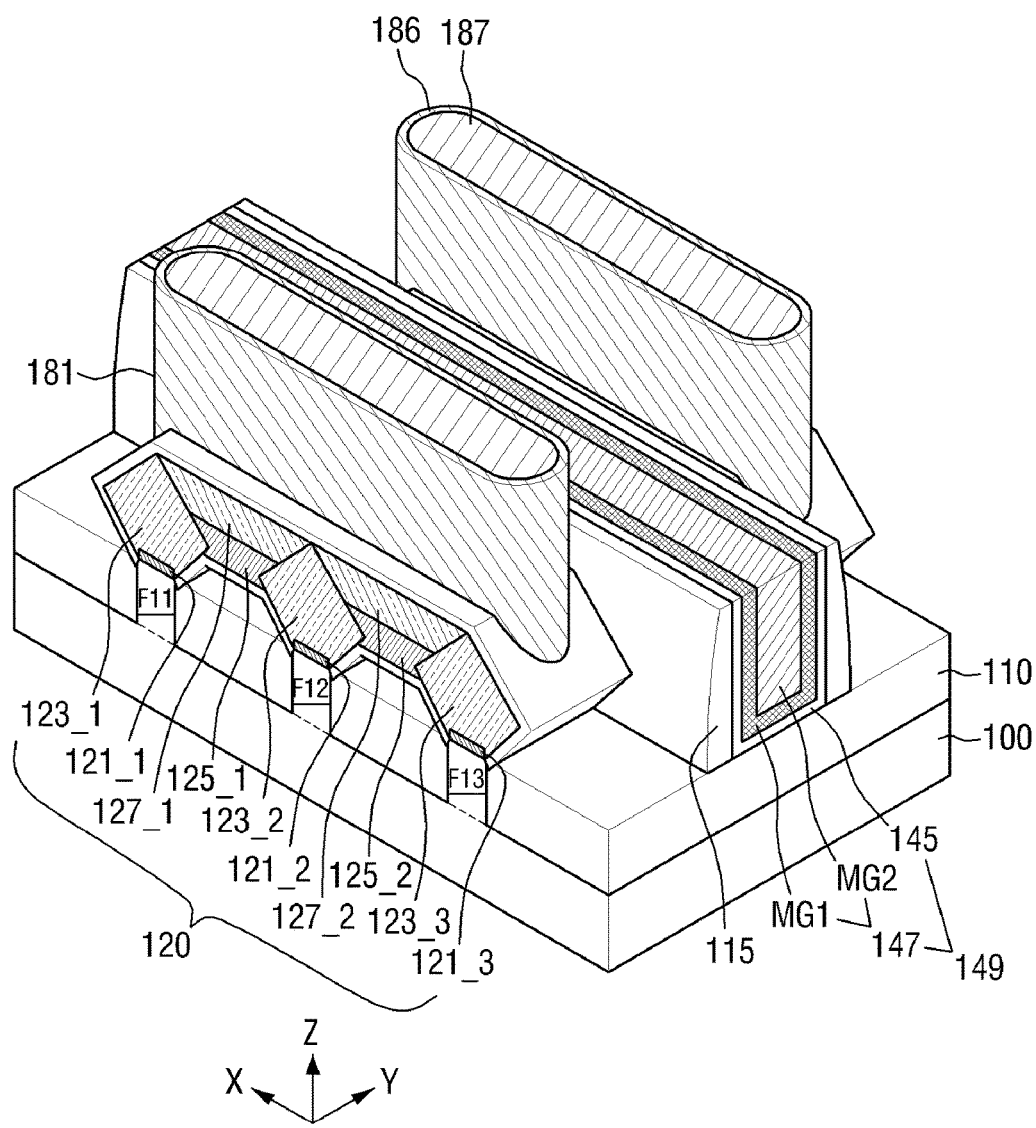
FIG. 10 is a perspective view of a semiconductor device according to a third embodiment of the present invention.

FIG. 10 is a perspective view of a semiconductor device according to a third embodiment of the present invention. For ease of illustration, first and second interlayer dielectric layers 171 and 172 are not illustrated in FIG. 10. The following description will focus on differences between the present embodiment and the previous embodiment shown in FIGS. 1 to 5A and detailed description of shared features will be omitted.

Referring to FIG. 10, a first source/drain 120 according to the embodiment of the present invention may be formed on three or more fins F11, F12 and F13. In FIG. 10, three F11, F12 and F13 are exemplified, but aspects of the present invention are not limited thereto. Four or more fins may be formed on the substrate 100. A plurality of elevated doped regions 123_1, 123_2 and 123_3 may be formed on a plurality of fins F11, F12 and F13, respectively, and first bridges 125_1 and 125_2 connecting the plurality of elevated doped regions 123_1, 123_2 and 123_3 may be formed between each of the plurality of elevated doped regions 123_1, 123_2 and 123_3. Second bridges 127_1 and 127_2 filling spaces between the plurality of elevated doped regions 123_1, 123_2 and 123_3 may be formed on the first bridges 125_1 and 125_2. A first contact 181 may be formed to make contact with the plurality of elevated doped regions 123_1, 123_2 and 123_3 and the second bridges 127_1 and 127_2.

A plurality of seed layers 121_1, 121_2 and 121_3 may be formed between the plurality of fins F11, F12 and F13 and the plurality of elevated doped regions 123_1, 123_2 and 123_3.

A first capping layer 129 may be formed on sidewalls of the plurality of elevated doped regions 123_1, 123_2 and 123_3 and on bottom surfaces of the first bridges 125_1 and 125_2. However, the first capping layer 129 may not be formed on the first bridges 125_1 and 125_2.

The plurality of elevated doped regions 123_1, 123_2 and 123_3, the first bridges 125_1 and 125_2, the second bridges 127_1 and 127_2 and the plurality of seed layers 121_1, 121_2 and 121_3 may include impurities. The first capping layer 129 may not be conductive and not include impurities.

Hereinafter, a semiconductor device according to a fourth embodiment of the present invention will be described with reference to FIGS. 11A and 12A.

Figure 11A:
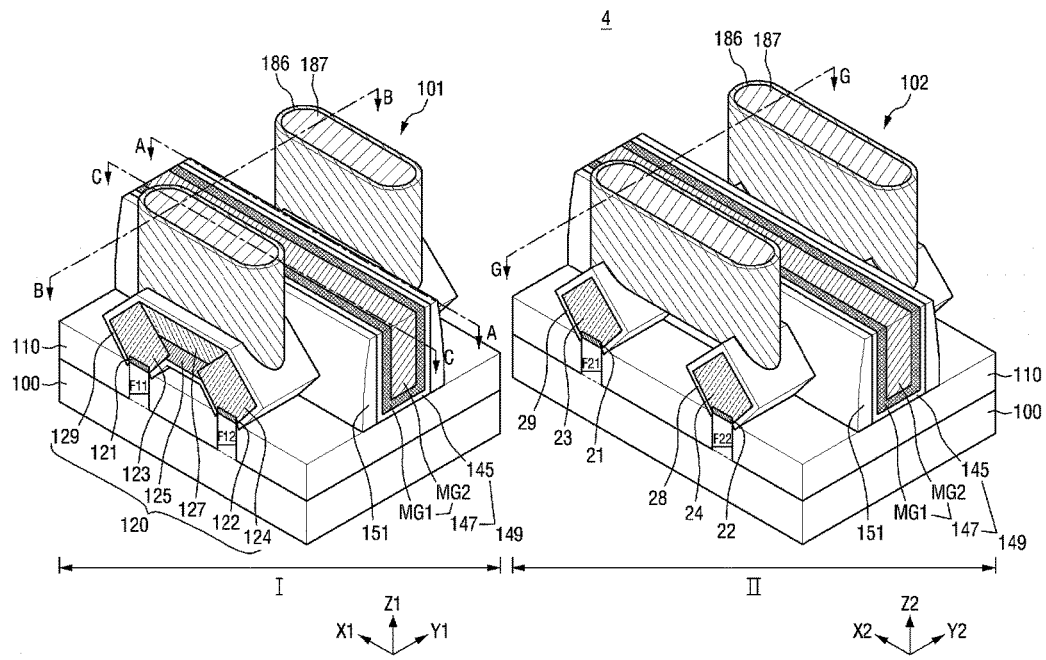
FIG. 11A is a perspective view of a semiconductor device according to a fourth embodiment of the present invention and FIG. 11B illustrates an alternative with respect to the semiconductor device of FIG. 11B.
Figure 12A:
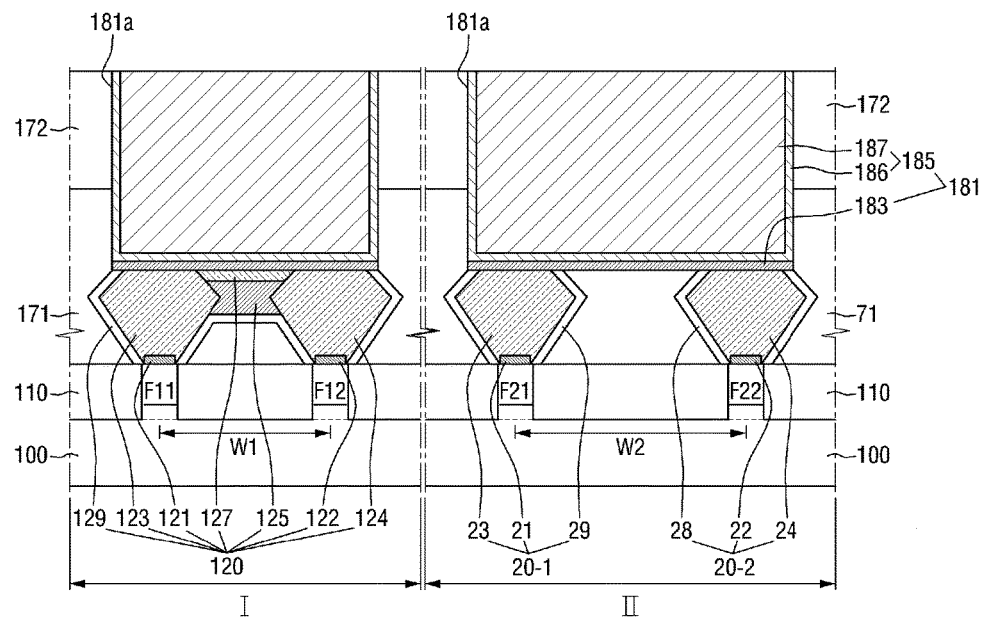
FIG. 12A is a cross-sectional view of the semiconductor device, taken along the line C-C of FIG. 11A.

FIG. 11A is a perspective view of a semiconductor device according to a fourth embodiment of the present invention, and FIG. 12A is a cross-sectional view of the semiconductor device, taken along the line C-C of FIG. 11A. For ease of illustration, first and second interlayer dielectric layers 171 and 172 are not illustrated in FIG. 11A. The following description will focus on differences between the present embodiment and the previous embodiment shown in FIGS. 1 to 5A and detailed description of shared features will not be repeated.

Referring to FIGS. 11A and 12A, in the semiconductor device 4 according to the fourth embodiment of the present invention, a substrate 100 may include a first region I and a second region II. For example, the first region I is a logic region and the second region II is an SRAM region, but aspects of the present invention are not limited thereto. The first region I and the second region II may be isolated from each other by field isolation, such as by isolation layer 110. The first region I may be a logic region and the second region II may be a region where other types of memories (for example, DRAM, MRAM, RRAM, PRAM, etc.) are to be formed.

A first fin type transistor 101 may be formed on the first region I. Since the first fin type transistor 101 is the same as the semiconductor device 1 shown in FIGS. 1 to 5A, a detailed description thereof will be omitted. In alternative embodiments, the first fin type transistor 101 may comprise the transistor described with respect to FIG. 9 and/or FIG. 10.

A second fin type transistor 102 may be formed on the second region II. The second fin type transistor 102 may include a third fin F21, a fourth fin F22, a first gate structure 149, a third elevated doped region 23, a fourth elevated doped region 24, a first contact 181, and so on.

On the substrate 100, the third fin F21 and the fourth fin F22 extend in parallel with each other and may be formed to be adjacent to each other in a long side direction (i.e., in a Y2 direction). In FIG. 11A, the long side direction is a fifth direction (the Y2 direction), but aspects of the present invention are not limited thereto. For example, the long side direction may be a fourth direction (i.e., an X2 direction). The fourth direction (X2), the fifth direction (Y2) and a sixth direction (Z2) may be parallel to a first direction (X1), a second direction (Y1) and a third direction (Z1), respectively, but aspects of the present invention are not limited thereto.

The first gate structure 149 is formed to overlap the third fin F21 and the fourth fin F22. Since the structure of first gate structure 149 of the second region II is the same as the structure the first gate structure 149 of the first region I, a detailed description thereof will be omitted. Note, however, the first gate structure 149 of the second region II and the first gate structure 149 may be elements of the same gate line (e.g., forming portions of the same electrical node) or may be elements of different gate lines (e.g., elements of different electrical nodes). A spacer 151 may be formed on sidewalls of the first gate structure 149.

A plurality of sources/drains 20-1 and 20-2 may be formed at both sides of the first gate structure 149 of the second region II. The plurality of sources/drains 20-1 and 20-2 may include the third and fourth elevated doped regions 23 and 24 and the first and second capping layers 29 and 28.

The third elevated doped region 23 is formed on the third fin F21, and the fourth elevated doped region 24 is formed on the fourth fin F22. As shown in FIG. 12A, top surfaces of the third and fourth elevated doped regions 23 and 24 may be higher than a bottom surface of the first interlayer dielectric layer 171.

The third and fourth elevated doped regions 23 and 24 are simultaneously formed with the first and second elevated doped regions 123 and 124, and may include a first doping concentration of impurities The third seed layer 21 may be formed between the third fin F21 and the third elevated doped region 23 and the fourth seed layer 22 may be formed between the fourth fin F22 and the fourth elevated doped region 24. The third and fourth seed layers 21 and 22 may include impurities and may serve as seeds required for forming the third and fourth elevated doped regions 23 and 24. The third and fourth seed layers 21 and 22 may be formed at the same time when the first and second seed layers 121 and 122 are formed and may include the same doping concentration of impurities with that of the first and second seed layers 121 and 122.

A pitch distance W12 between the third fin F21 and the fourth fin F22 of the second region II is greater than a pitch distance W11 between the first fin F11 and the second fin F12 of the first region I. Since the distance between the third elevated doped region 23 and the fourth elevated doped region 24 is relatively long, a bridge is not formed between the third and fourth elevated doped regions 23 and 24. Therefore, the third and fourth elevated doped regions 23 and 24 are physically separated from each other. For example, the pitch distance W11 may be less than 48 nm. Thus a distance between adjacent corners of elevated doped regions 123 and 124 is also less than 48 nm. The pitch distance W11 may be chosen so that the adjacent corners of elevated doped regions 123 and 124 are in contact with each other after growth of doped regions 123 and 124. The pitch distance W12 may be greater than 68 nm or greater than 78 nm. A distance between adjacent corners of elevated doped regions 123 and 124 after growth of elevated doped regions 123 and 124 may be substantial so that epitaxial bridge growth does not occur during formation of the bridge between elevated doped regions 123 and 124. The distances between adjacent surfaces of the elevated growth regions may be used as a mechanism to selectively epitaxially grow (or not grow) a bridge therebetween; when the pitch distance of adjacent fins is short enough (e.g., less than about 48 nm) epitaxial growth may occur, when the pitch distance between adjacent fins is long enough (e.g., greater than 68 nm or greater than 78 nm), epitaxial growth may be prevented from occurring or lessened to an insignificant amount. Here, the phrase "physically separated" is used to mean that the third elevated doped region 23 and the fourth elevated doped region 24 are spaced apart from each other and there is no conductive material connecting the third elevated doped region 23 and the fourth elevated doped region 24, except for the first contact 181. Consequently, a space between the third elevated doped region 23 and the fourth elevated doped region 24 is filled with an insulating material, and the third and fourth elevated doped regions 23 and 24 are not in contact with or connected with a bridge directly between each other.

The first and second capping layers 29 and 28 are formed on sidewalls of the third elevated doped region 23 and the fourth elevated doped region 24. Since no bridge is formed in the second region II, the first and second capping layers 29 and 28 may also be formed on the entire sidewalls of the third and fourth elevated doped regions 23 and 24 between the third and fourth elevated doped regions 23 and 24. The first and second capping layers 29 and 28 may not be conductive and may not include impurities (e.g., they may comprise undoped silicon). The first interlayer dielectric layer 171 may be formed in the remaining space between the third and fourth elevated doped regions 23 and 24.

The first contact 181 making contact with the third and fourth elevated doped regions 23 and 24 may be formed on the third and fourth elevated doped regions 23 and 24. In this example, the first contact 181 of the second region II is the same as the contact 181 of the first region I, a repetitive description of the same will be omitted.

Figure 11B:
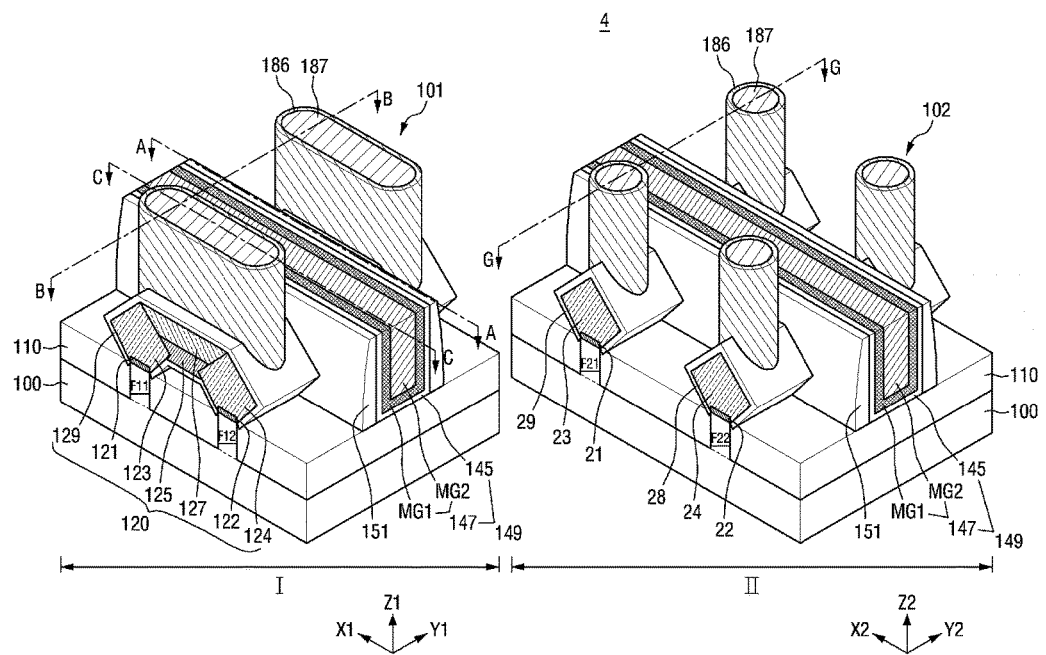
Figure 12B:
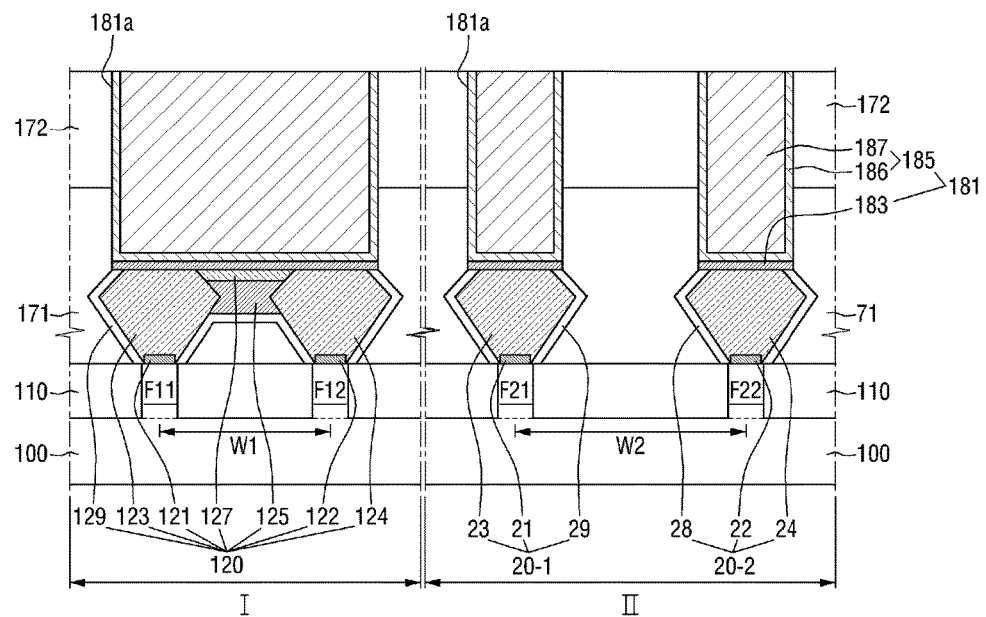
FIG. 12B is a cross-sectional view of the semiconductor device, taken along the line C-C of FIG. 11B.

The first contact 181 in the second region II may not be shared with plural S/D regions 20-1 and 20-2 and may instead be replaced by two separate contacts (that may comprise separate electrical nodes) each of which individually contact one of the S/D regions 20-1 and 20-2. An example of this modification is shown in FIGS. 11B and 12B, FIG. 12B being a cross section taken along line G-G in FIG. 11B. As shown in FIGS. 11B and 12B, each of the source/drains (e.g., 20-1 and 20-2) are in contact with a dedicated contact (e.g., having a one to one relationship). The first gate structure 149 of the second region II and the first gate structure 149 may be elements of the same gate line (e.g., forming portions of the same electrical node) or may be elements of different gate lines (e.g., elements of different electrical nodes). In such an alternative, two separate transistors may be formed by the structure in region II in FIGS. 11B and 12B. In addition, second gate structure 149 in the second region II may be replaced by two separate gate structures (e.g., not being electrically connected or forming separate electrical nodes), each dedicated to one of fins F21 and F22. Remaining structure of this alternative embodiment may be the same as the original fourth embodiment of FIGS. 11A and 12A, and thus this description may apply to both the original and modified embodiments.

Portions of sidewalls of the first contact 181 of the second region II may be covered by a first interlayer dielectric layer 171 and the rest portions of the sidewalls of the first contact 181 may be covered by a second interlayer dielectric layer 172. The first and second interlayer dielectric layers 171 and 172 may include at least one of an oxide film, a nitride film and an oxynitride film.

A first fin type transistor 101 and a second fin type transistor 102 may be P type transistors. The impurities included in the first to fourth elevated doped regions 123, 124, 23 and 24 may include a first impurity having a greater lattice constant than Si, for example, germanium (Ge). In addition, the impurities included in the first to fourth elevated doped regions 123, 124, 23 and 24 may further include a second impurity for reducing SBH, for example, boron (B), phosphorus (P) or arsenic (As).

The first and second fin type transistors 101 and 102 are both P type transistors, but are formed at different regions. First and second bridges 125 and 127 are formed in the first fin type transistor 101 in the first region I, while not being formed in the second fin type transistor 102 in the second region II.

Hereinafter, a semiconductor device according to a fifth embodiment of the present invention will be described with reference to FIGS. 13A to 16A.

Figure 13A:
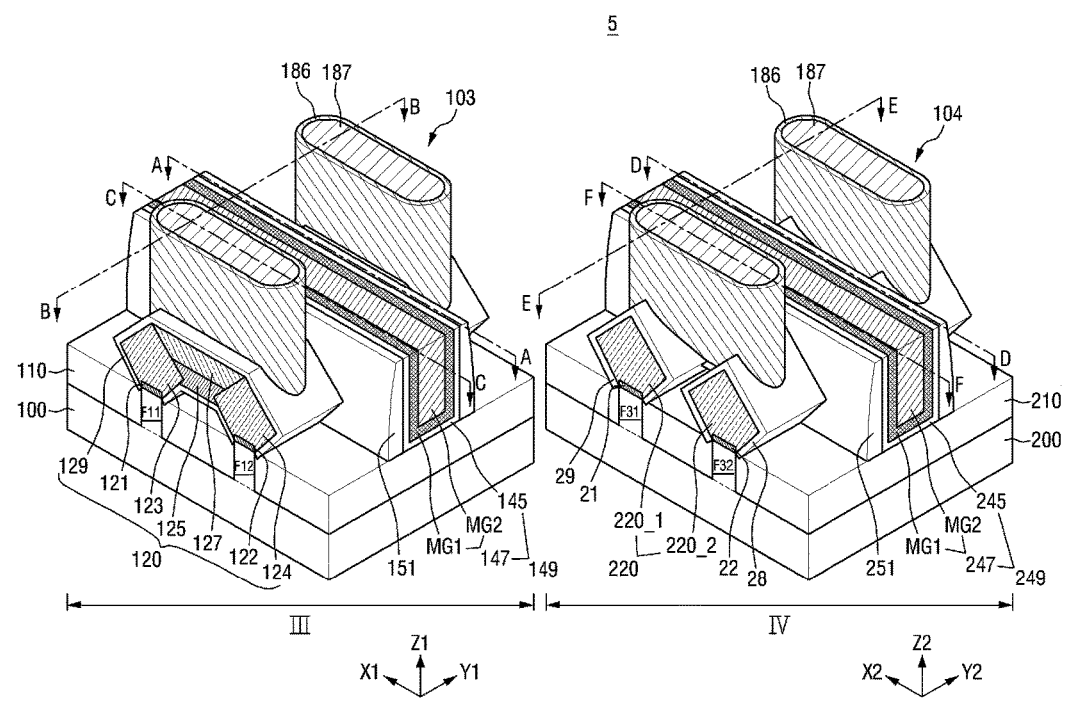
FIG. 13A is a perspective view of a semiconductor device according to a fifth embodiment of the present invention and FIG. 13B illustrates an alternative structure with respect to the structure of FIG. 13A.
Figure 14:
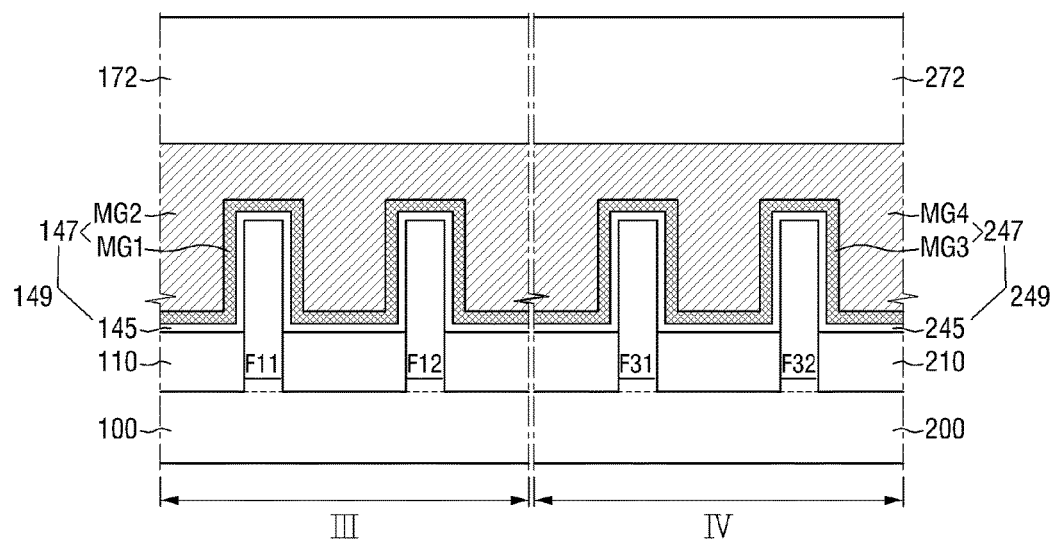
FIG. 14 is a cross-sectional view of the semiconductor device, taken along the lines A-A and D-D of FIGS. 13A and 13B.
Figure 15:
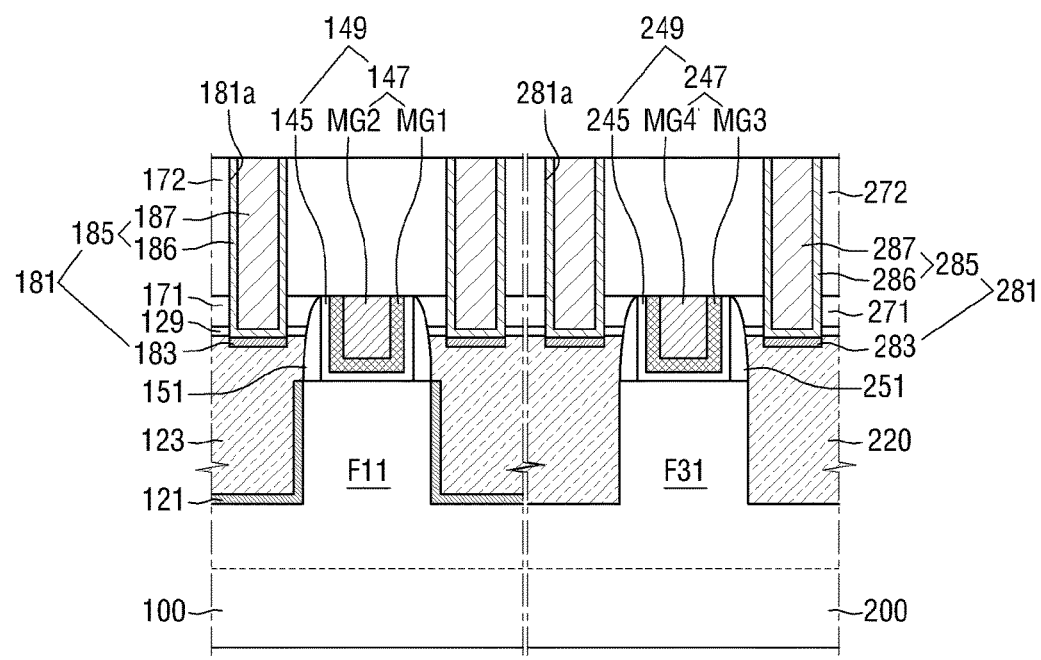
FIG. 15 is a cross-sectional view of the semiconductor device, taken along the lines B-B and E-E of FIGS. 13A and 13B.
Figure 16A:
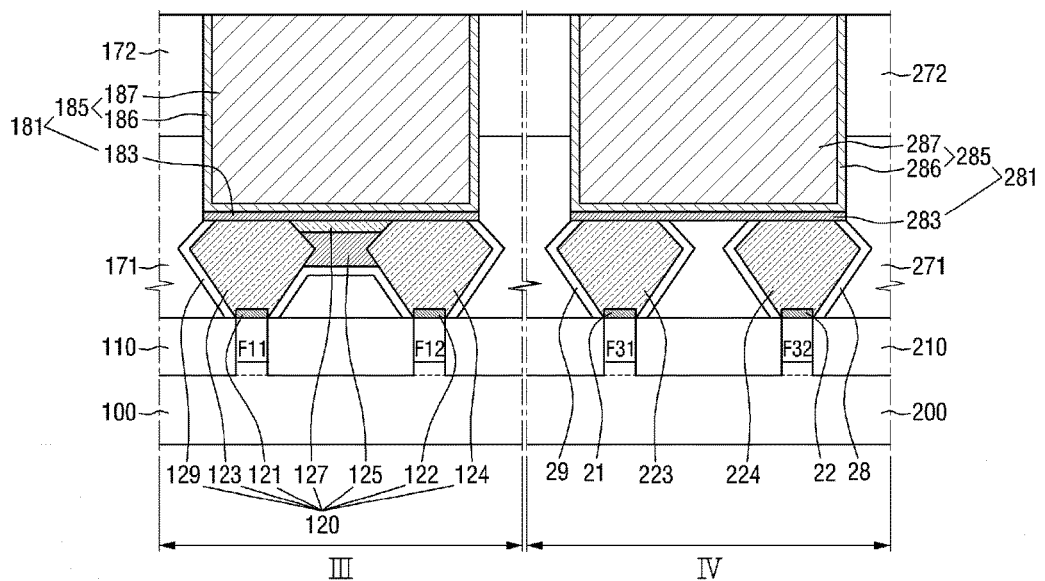
FIG. 16A is a cross-sectional view of the semiconductor device, taken along the lines C-C and F-F of FIG. 13A.

FIG. 13A is a perspective view of a semiconductor device according to a fifth embodiment of the present invention, FIG. 14 is a cross-sectional view of the semiconductor device, taken along the lines A-A and D-D of FIG. 13A, FIG. 15 is a cross-sectional view of the semiconductor device, taken along the lines B-B and E-E of FIG. 13A, and FIG. 16A is a cross-sectional view of the semiconductor device, taken along the lines C-C and F-F of FIG. 13A. For ease of illustration, first and second interlayer dielectric layers 171, 172, 271 and 272 are not illustrated in FIG. 13A. Further, the following description will focus on differences between the present embodiment and the previous embodiment shown in FIGS. 1 to 5A, thus repetitive detailed description regarding shared features may be omitted.

Referring to FIGS. 13A to 16A, in the semiconductor device 5A according to the fifth embodiment of the present invention, a substrate 100 may include a third region III and a fourth region IV. The third region III is a region where a third fin type transistor 103 of a first conductivity type (e.g., p type) is formed, and the fourth region IV is a region where a fourth fin type transistor 104 of a second conductivity type (e.g., n type) is formed.

The third fin type transistor 103 formed on the third region III may include first and second fins F11 and F12, a first gate structure 149 formed to intersect the first and second fins F11 and F12, a first source/drain 120 formed on a plurality of first fins F11 and F12 at both sides of the first gate electrode 147, and a first contact 181. Since the third fin type transistor 103 formed on the third region III is the same as that shown in FIGS. 1 to 5A, a detailed description thereof will be omitted. In alternative embodiments, the third fin type transistor 103 may comprise the transistor described with respect to FIG. 9 and/or FIG. 10.

The fourth fin type transistor 104 formed on the fourth region IV may include fifth and sixth fins F31 and F32 formed on a substrate 200, a second gate structure 249 formed to intersect the fifth and sixth fins F31 and F32, a second source/drain 220 formed on the fifth and sixth fins F31 and F32 at both sides of the second gate structure 249 and including fifth and sixth elevated doped regions 220_1 and 220_2, and a second contact 281 formed on the second source/drain 220 to make contact with the second source/drain 220. The fifth and sixth fins F31 and F32 may extend lengthwise along a fifth direction Y2, and the second gate structure 249 may extend lengthwise along a fourth direction X2. The fifth and sixth fins F31 and F32 are formed to be adjacent to each other.

The fifth elevated doped region 220_1 is formed on the fifth fin F31 and the sixth elevated doped region 220_2 is formed on the sixth fin F32. Since the fifth and sixth elevated doped regions 220_1 and 220_2 are elevated regions, top surfaces thereof are higher than a bottom surface of an isolation layer 210. The fifth and sixth elevated doped regions 220_1 and 220_2 are physically separated from each other and sidewalls of the fifth and sixth elevated doped regions 220_1 and 220_2 are surrounded by the first interlayer dielectric layer 271.

The second source/drain 220 may have a conductivity type different from that of the first source/drain 120. The second source/drain 220, including the fifth and sixth elevated doped regions 220_1 and 220_2, may have third impurity different from the impurity of the first source/drain 120. The third impurity may be an n-type impurity and the impurity of the first source/drain may be a p-type impurity. Alternately, the third type impurity may be a p-type impurity and the impurity of the first source/drain 120 may an n-type impurity (in this alternative, the third transistor comprises a nMOS and the fourth transistor comprises a pMOS). Since the third fin type transistor 103 and the fourth fin type transistor 104 have different conductivity types, the second source/drain 220 may include a third impurity. For example, when the substrate 200 includes Si, the third impurity may be arsenic (As) or carbon (C) having a smaller lattice constant than Si so as to be capable of applying tensile stress to a channel region. Alternatively, when the substrate 200 includes Si, the second source/drain 220 may not include the third impurity.

The second contact 281 is formed on the fifth and sixth elevated doped regions 220_1 and 220_2. The second contact 281 may contact top surfaces of the fifth and sixth elevated doped regions 220_1 and 220_2.

The second contact 281 may electrically connect a wire and the second source/drain 220 to each other and may include a second silicide layer 283 and a conductive layer 285. The second silicide layer 283 is formed on a bottom surface of the second contact 281 and may make contact with the fifth elevated doped region 220_1 and the sixth elevated doped region 220_2.

The conductive layer 285 may be formed on the second silicide layer 283. The conductive layer 285 may include a first conductive layer 286 and a second conductive layer 287. The first conductive layer 286 may be conformally formed along the sidewalls and bottom surface of the second contact hole 281a. The second conductive layer 287 may be formed to fill the rest portions of the second contact hole 281a.

The silicide layer 283 may include, for example, a conductive material, such as Co, Ni, or Pt, but aspects of the present invention are not limited thereto.

The conductive layer 285 may include a conductive material. For example, the first conductive layer 286 may include Ti and the second conductive layer 287 may include W, Al or Cu, but aspects of the present invention are not limited thereto.

The first interlayer dielectric layer 271 and the second interlayer dielectric layer 272 are sequentially formed on the isolation layer 210. The first interlayer dielectric layer 271 may cover the second source/drain 220 and portions of sidewalls of the second contact 281. The second interlayer dielectric layer 272 may cover the rest portions of the sidewalls of the second contact 281.

As shown in FIG. 15, a top surface of the first interlayer dielectric layer 271 may be on the same level with a top surface of the second gate electrode 247. The top surface of the first interlayer dielectric layer 271 and the top surface of the second gate electrode 247 may also be at the same level (e.g., same plane) as the top surfaces of the first dielectric layer 171 and gate electrode 149. The top surfaces of the first interlayer dielectric layer 271 and the second gate electrode 247 (as well as the first dielectric layer 171 and gate electrode 149) may be on the same level with each other through planarization (e.g., a CMP process). The second interlayer dielectric layer 272 may be formed to cover the second gate electrode 247. The first interlayer dielectric layer 271 and the second interlayer dielectric layer 272 may include at least one of an oxide film, a nitride film and an oxynitride film.

The second gate structure 249 may include a second gate electrode 247 and a second gate insulation layer 245.

The second gate electrode 247 may include metal layers MG3 and MG4. As shown, the second gate electrode 247 may include two or more metal layers MG3 and MG4 stacked one on another. The third metal layer MG3 may control a work function, and the fourth metal layer MG4 may fill a space formed by the third metal layer MG3. For example, the third metal layer MG3 may include at least one of TiN, TaN, TiC, and TaC. In addition, the fourth metal layer MG4 may include W or Al. Further, the second gate electrode 247 may be made of Si or SiGe, instead of a metal. The second gate electrode 247 may be formed by, for example, a replacement process (e.g., where a dummy gate is first formed, removed, and replaced with the second gate electrode 247), but aspects of the present invention are not limited thereto.

The second gate insulation layer 245 may be formed between the fifth fin F31, the sixth fin F32 and the second gate electrode 247. As shown in FIG. 14, the second gate insulation layer 245 may be formed on a top surface and upper portions of lateral surfaces of the fifth fin F31 and on a top surface and upper portions of lateral surfaces of the sixth fin F32. In addition, the second gate insulation layer 245 may be disposed between the second gate electrode 247 and the isolation layer 210. The second gate insulation layer 245 may include a high-k material having a higher dielectric constant than silicon oxide. The high-k dielectric preferably may have a dielectric constant of 6 or greater. Alternatively, the high-k dielectric may have a dielectric constant of 8 or greater, larger than 10. For example, the second gate insulation layer 245 may include $HfO_2$, $ZrO_2$ or $Ta_2O_5$.

A spacer 251 may be formed on sidewalls of the second gate structure 249 and may include at least one of a nitride film and an oxynitride film.

Figure 13B:
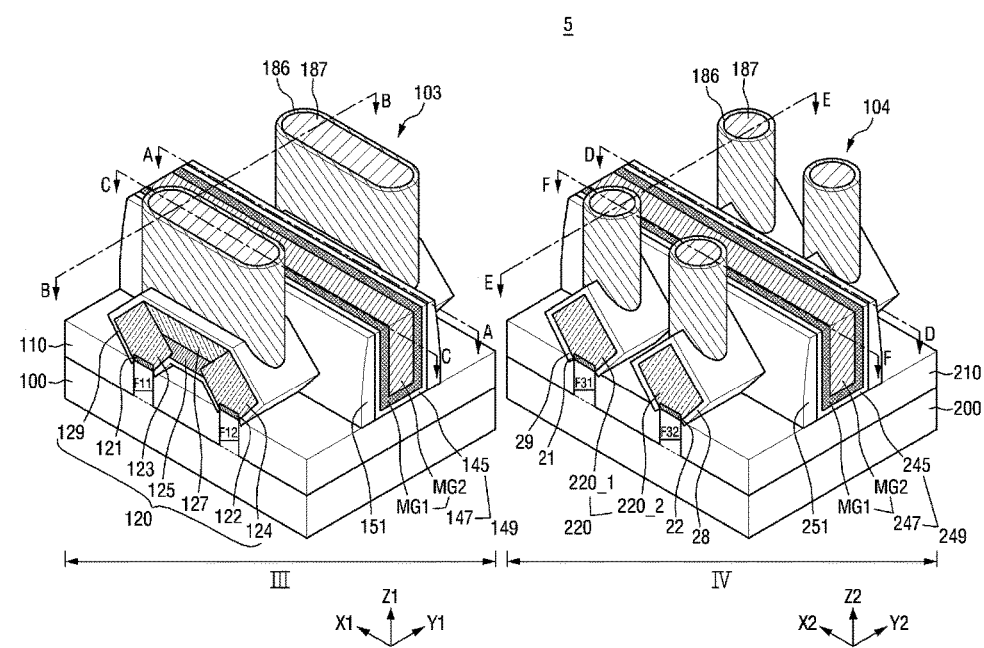
Figure 16B:
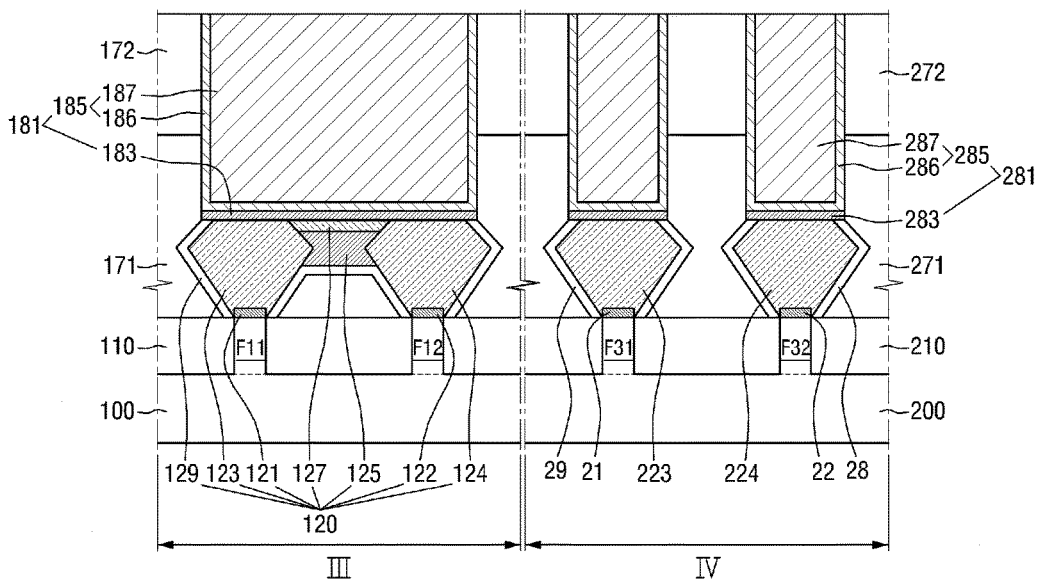
FIG. 16B is a cross-sectional view of the semiconductor device, taken along the lines C-C and F-F of FIG. 13B.

The first contact 281 in the fourth region II may not be shared with plural S/D regions 20-1 and 20-2 and may instead be replaced by two separate contacts (that may comprise separate electrical nodes) each of which individually contact one of the S/D regions 220-1 and 220-2. An example of this modification is shown in FIGS. 13B and 16B, FIG. 16B being a cross section taken along line E-E in FIG. 13B. As shown in FIGS. 13B and 16B, each of the source/drains (e.g., 220-1 and 220-2) are in contact with a dedicated contact (e.g., having a one-to-one relationship). The first gate structure 149 of the fourth region IV and the first gate structure 149 of the third region III may be elements of the same gate line (e.g., forming portions of the same electrical node) or may be elements of different gate lines (e.g., elements of different electrical nodes). In such an alternatives, two separate transistors may be formed by the structure in region IV in FIGS. 13B and 16B. In addition, second gate structure 249 in the fourth region IV may be replaced by two separate gate structures (e.g., not being electrically connected or forming separate electrical nodes), each dedicated to one of fins F31 and F32. Remaining structure of this alternative embodiment may be the same as the original fourth embodiment of FIGS. 13A to 16B.

Figure 17A:
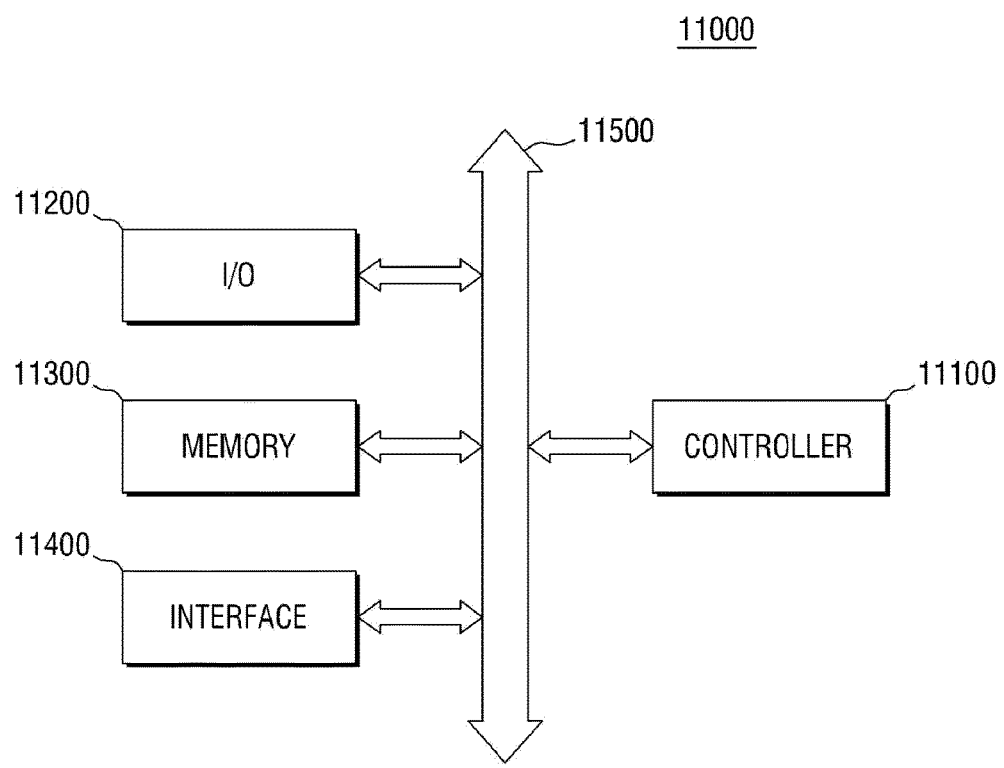
FIG. 17A is a block diagram of an electronic system including semiconductor devices according to some embodiments of the present invention.

FIG. 17A is a block diagram of an electronic system according to some embodiments of the invention. The electronic system 11000 may include one or more of the exemplary semiconductor devices described herein, such as semiconductor devices 1 to 5A.

Referring to FIG. 17A, the electronic system 11000 may include a controller 1110, an input/output device (I/O) 11200, a memory device 11300, an interface 11400 and a bus 11500. The controller 11100, the I/O 11200, the memory device 11300, and/or the interface 11400 may be connected to each other through the bus 11500. The bus 11500 corresponds to a path through which data moves.

The semiconductor devices 1 to 5A according to some embodiments of the present invention may be used to form one or more of the logic blocks 1110, 11200, 11300 and 11400.

The controller 11100 may include at least one of a microprocessor, a digital signal processor, a microcontroller, and logic elements capable of functions similar to those of these elements. The I/O 11200 may include a keypad, a keyboard, a display device, and so on. The memory device 11300 may store data and/or commands. The interface 11400 may perform functions of transmitting data to a communication network or receiving data from the communication network. The interface 11400 may be wired or wireless. For example, the interface 11400 may include an antenna or a wired/wireless transceiver, and so on. Although not shown, the electronic system 11000 may further include high-speed DRAM and/or SRAM as a working memory for improving the operation of the controller 11100. The semiconductor devices 1 to 5A according to some embodiments of the present invention may be provided in the memory device 11300 or may be provided as some components of the controller 11100 or the I/O 11200.

The electronic system 11000 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 17B:
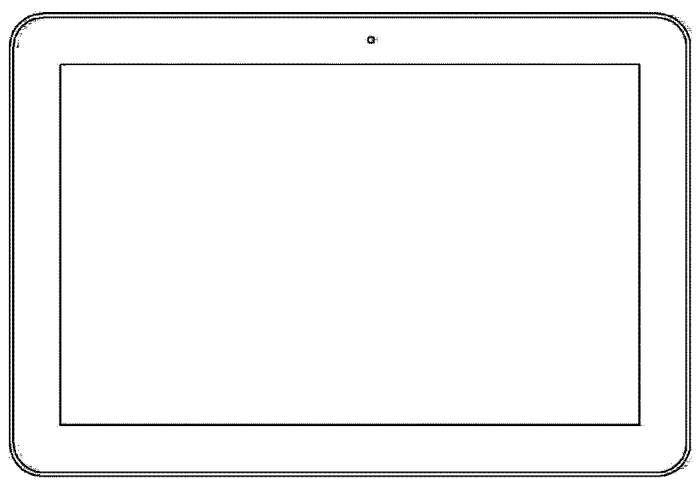
FIGS. 17B and 17C illustrate an exemplary semiconductor system to which semiconductor devices 1 to 5A according to some embodiments of the present invention can be employed.
Figure 17C:
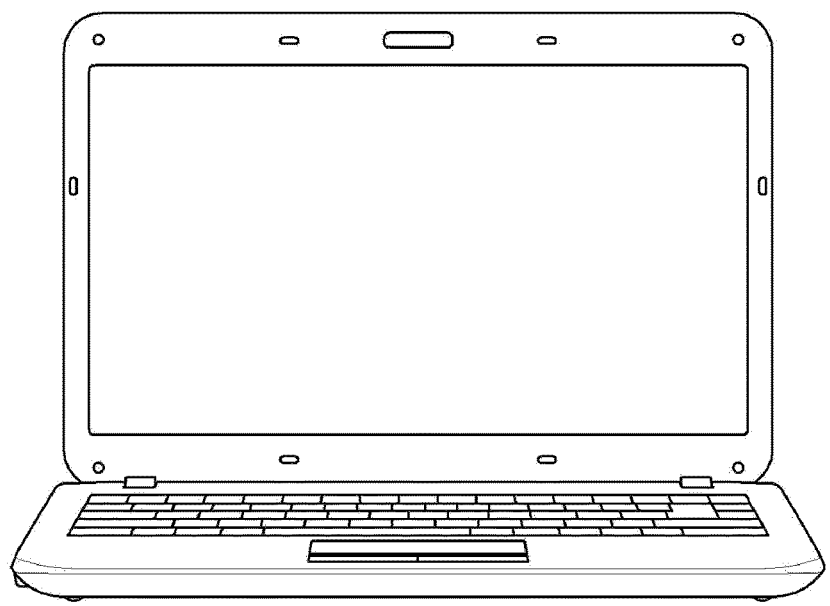

FIGS. 17B and 17C illustrate an exemplary semiconductor system according to some embodiments of the present invention. Exemplary semiconductor devices described herein, such as semiconductor devices 1 to 5A according to some embodiments of the present invention can be employed. FIG. 17B illustrates an example in which a semiconductor device according to an embodiment of the present invention is applied to a tablet PC, and FIG. 17C illustrates an example in which a semiconductor device according to an embodiment of the present invention is applied to a notebook computer. At least one of the semiconductor devices according to the first to fifth embodiments of the present invention can be used to form a tablet PC, a notebook computer, and the like. The semiconductor devices according to some embodiments of the present invention may also be applied to other integrated circuit devices not illustrated herein.

Next, a method of fabricating a semiconductor device according to a first embodiment of the present invention will be described with reference to FIGS. 1, 3 and 18 to 28.

FIGS. 18 to 28 are cross-sectional views sequentially illustrating intermediate stages in a method of fabricating the semiconductor device according to a first method embodiment of the present invention.

Figure 18:
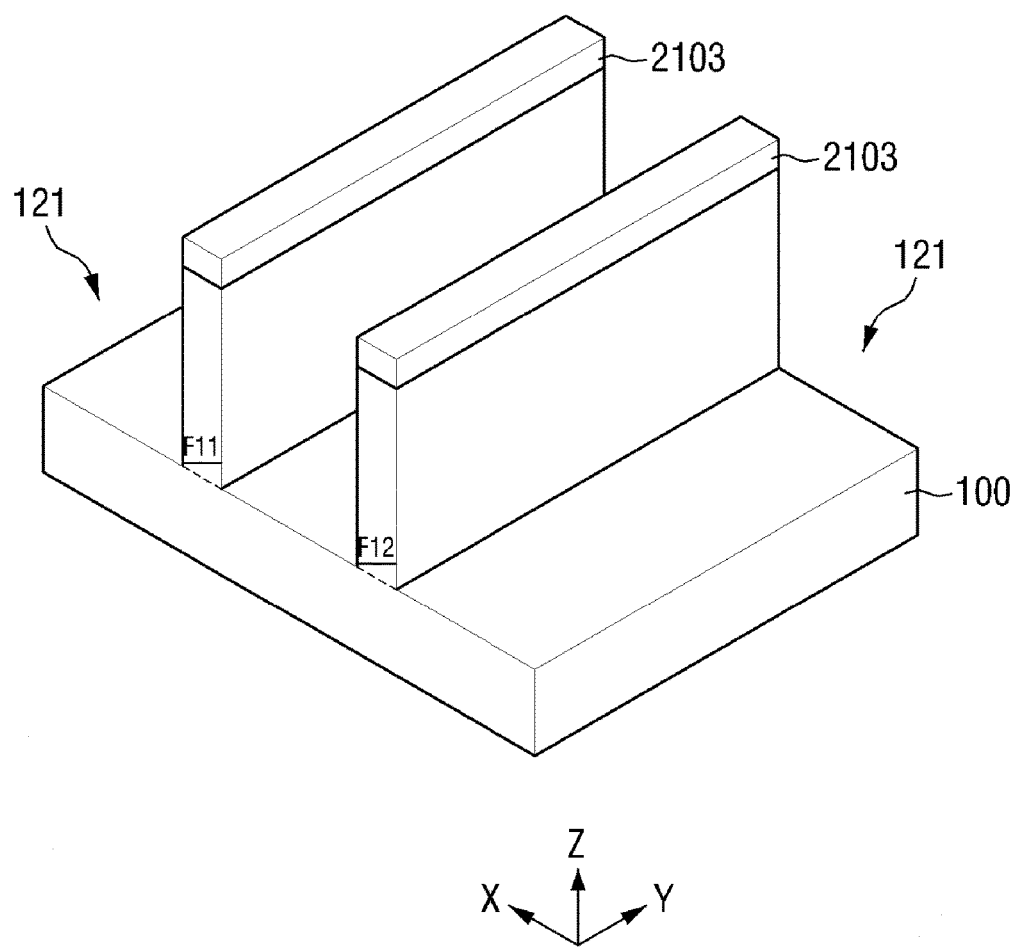

Referring first to FIG. 18, the first and second fins F11 and F12 are formed on the substrate 100.

In detail, after a mask pattern 2103 is formed on the substrate 100 (e.g., a crystalline semiconductor wafer or a silicon or other semiconductor on insulator substrate), an etching process is performed to form the first and second fins F11 and F12. The first and second fins F11 and F12 may be adjacent to each other and may extend in a long side direction (for example, the second direction Y1). The trench 121 is formed around the first and second fins F11 and F12. The mask pattern 2103 may include at least one of a silicon oxide film, a silicon nitride film and a silicon oxynitride film. Alternatively, the fins may be epitaxially grown from the substrate 100 (e.g., crystalline semiconductor wafer or a silicon or other semiconductor on insulator substrate). For example, a selective epitaxial growth may be performed by forming an insulator on the substrate 100, etching trenches in the insulator corresponding to fin locations, and epitaxially growing the fins within the trenches. Under either alternative, a substrate with fins results.

Figure 19:
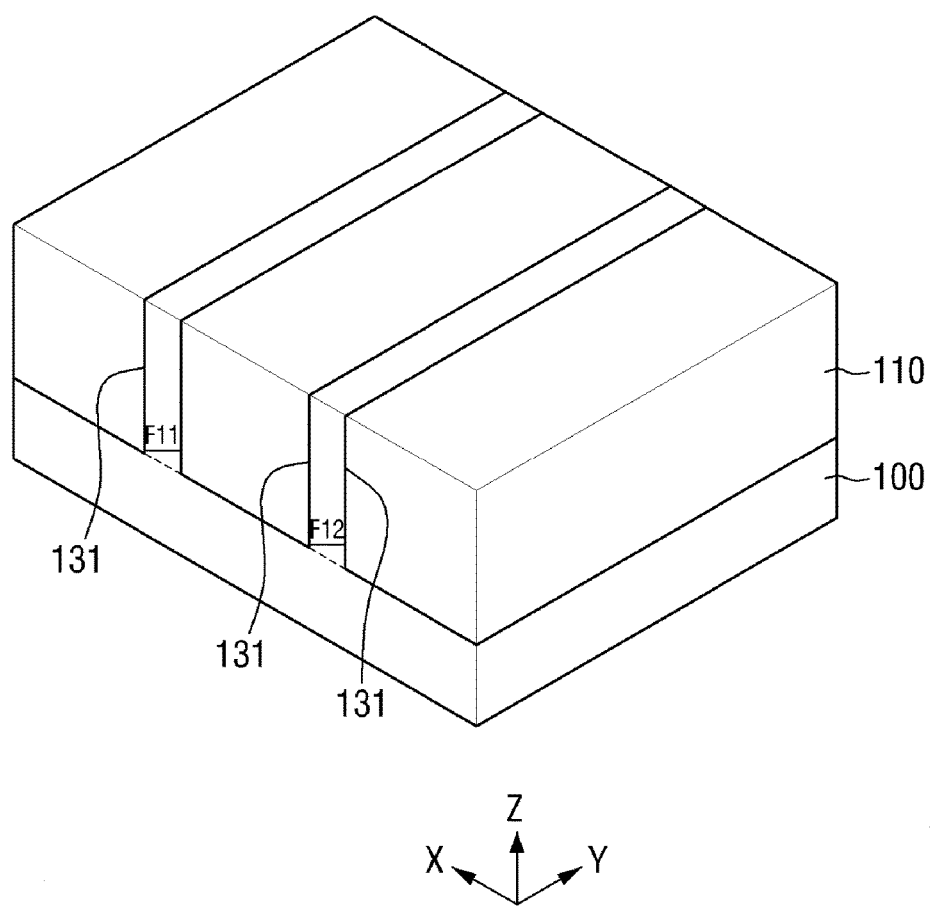

Referring to FIG. 19, the isolation layer 110 surrounding fins F11 and F12 including filling the trench 121 is formed. The isolation layer 110 may include at least one of a silicon oxide film, a silicon nitride film and a silicon oxynitride film. The isolation layer 110 may be deposited on side surfaces of the fins F11 and F12 and on top surfaces of fins F11 and F12. A planarization etch (e.g., chemical mechanical polishing) may remove upper portions of the isolation layer 110 and expose (and possibly etch) top surfaces of fins F11 and F12 to obtain the structure in FIG. 19.

Figure 20:
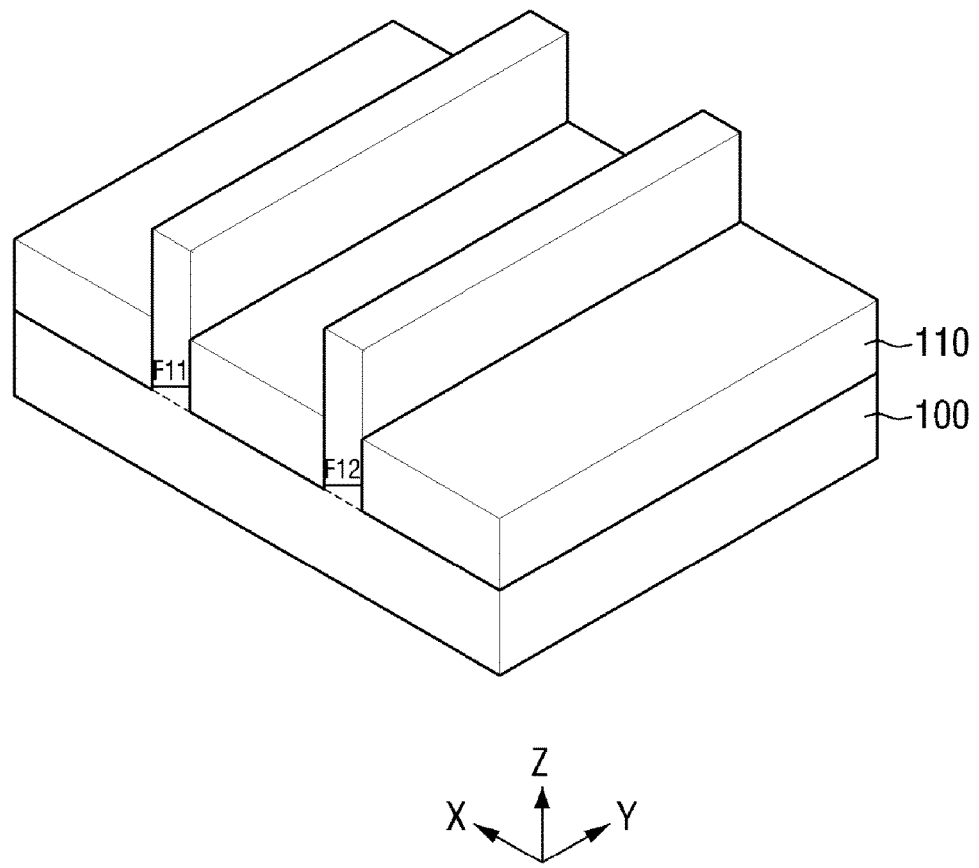

Referring to FIG. 20, a top portion of the isolation layer 110 is recessed so that top portions of the first and second fins F11 and F12 extend above a top surface of the isolation layer 110. The recess process may include a selective etching process. The mask pattern 2103 may be removed before forming the isolation layer 110 or after performing the recess process.

Portions of the first and second fins F11 and F12 protruding up from the isolation layer 110 may be formed by an epitaxial process. In detail, after forming the isolation layer 110, the portions of the first and second fins F11 and F12 may be formed by an epitaxial process using seeds the top surfaces of the first and second fins F11 and F12 exposed by the isolation layer 110 as seeds.

In addition, the first and second fins F11 and F12 may be doped with impurities to control an associated threshold voltage of transistors to be formed therein. For example, when an NMOS transistor is formed, boron (B) may be used as impurity, and when a PMOS transistor is formed, arsenic (As) or phosphorus (P) may be used as impurity.

Figure 21:
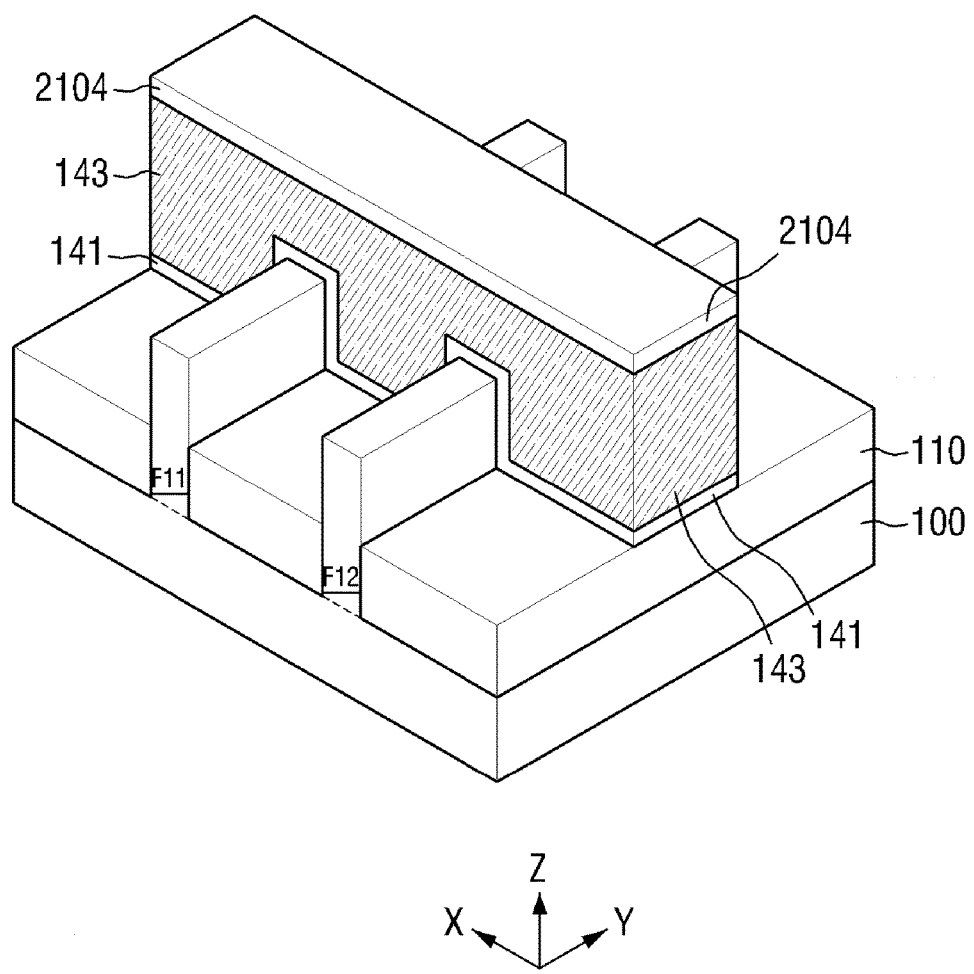

Referring to FIG. 21, an etching process is performed using a hard mask pattern 2104 to form a first dummy gate insulation layer 141 and a first dummy gate electrode 143 extending in a first direction X1 to extend across the first and second fins F11 and F12.

For example, the first dummy gate insulation layer 141 may be a silicon oxide film and the first dummy gate electrode 143 may comprise polysilicon.

Figure 22A:
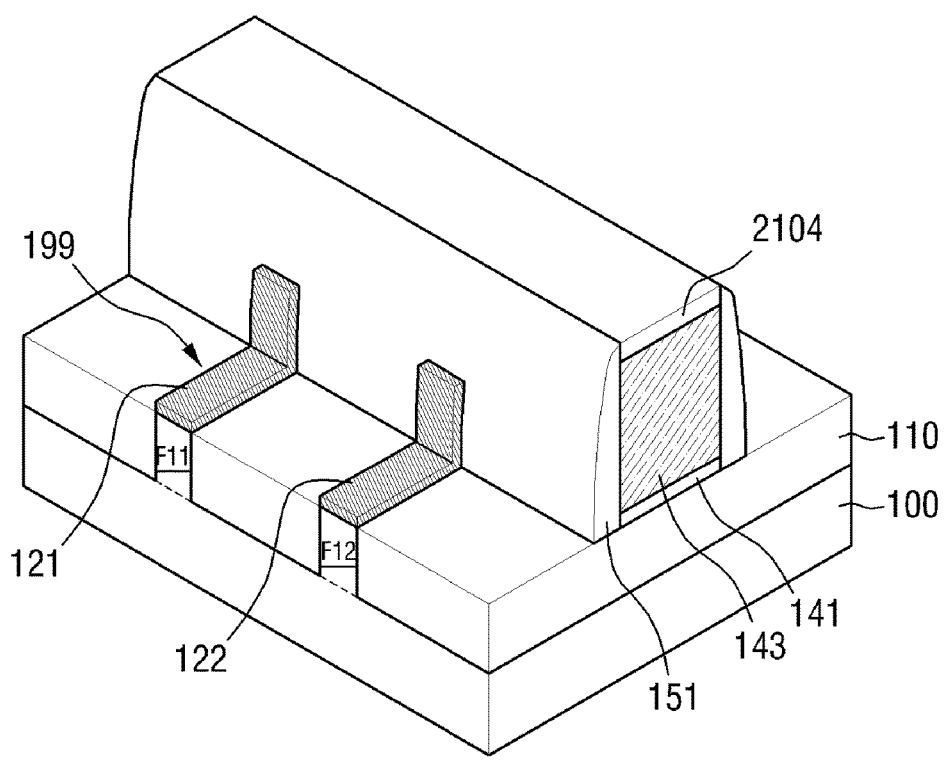
FIGS. 22A and 22B, are cross-sectional views sequentially illustrating intermediate stages in a method of fabricating the semiconductor device according to the first method embodiment an aspect of the present invention.

Referring to FIG. 22A, a first spacer 151 may be formed on sidewalls of the first dummy gate electrode 143 and may expose a top surface of the mask pattern 2104. The first spacer 151 may be a silicon nitride film or a silicon oxynitride film. For example, an insulating film (e.g., silicon nitride or silicon oxynitride) may be deposited over the structure illustrated in FIG. 21. Then, the insulting film may be etched to expose top surface of hard mask 2104. Remaining portions of the etched insulating film may form the sidewall spacers 151.

Figure 22B:
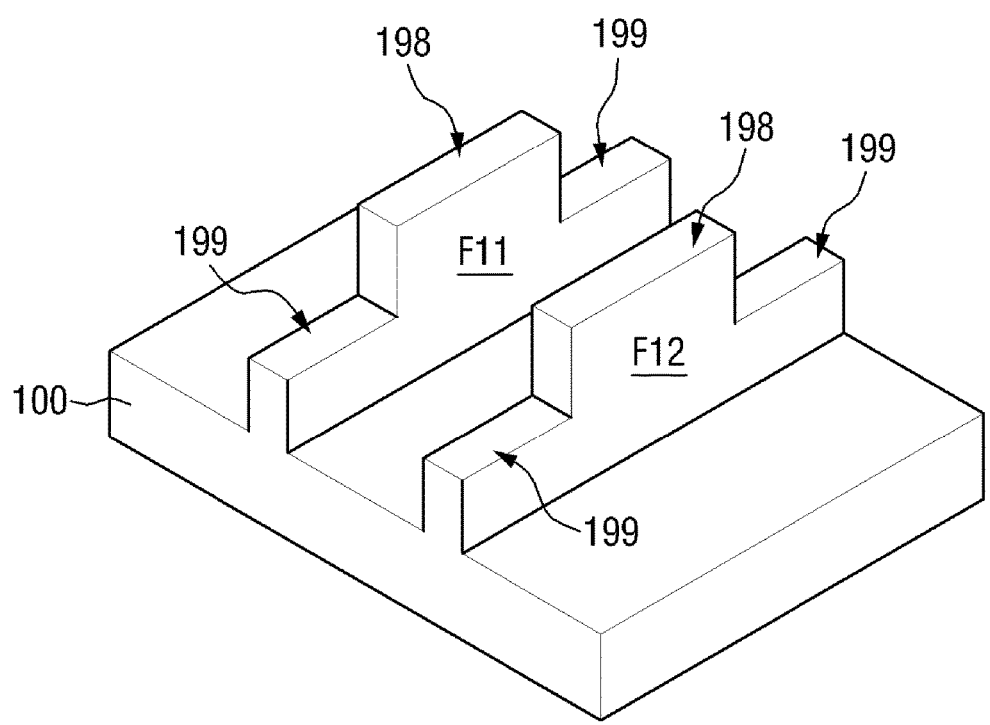

Next, portions of the first and second fins F11 and F12 exposed at both sides of the first dummy gate electrode 143 are etched to form a recesses 199 in fins F11 and F12. FIG. 22B is a perspective illustration showing an exemplary structure of the fins F11 and F12 after the recesses 199 are etched; other structure on fins F11 and F12 (e.g., as shown in FIG. 22A) is not illustrated in FIG. 22B. Pairs of recesses 199 in the fins F11 and F12 may each define a protrusion 198. The protrusion 198 may lie under the first dummy gate insulation layer 141, the first dummy gate electrode 143 and first spacers 151. The first dummy gate insulation layer 141 and first dummy gate electrode may be formed on the sidewalls and top surfaces of the protrusions 198. After a replacement process (described below), the first dummy gate electrode 143 and first dummy gate insulation layer 141 may be removed and replaced with a real gate electrode and real gate insulation layer so that the real gate electrode and real gate insulation layer are formed on the sidewalls and top surfaces of protrusions 198. Isolation layer 110 (not shown in FIG. 22B) is interposed between the substrate 100 and the gate insulation layer/gate electrode (dummy and real, depending on the stage of the process) at locations adjacent fins F11 and F12, including between the fins F11 and F12. Fin structure of this embodiment (e.g., as shown in FIGS. 22A and 22B) and their relationship to surrounding structure may be applicable to the fins of all embodiments described herein.

Next, in the recess 199, the first seed layer 121 is formed along a surface of the first fin F11 and the first elevated doped region 123 and the second seed layer 122 is formed along a surface of the second fin F12. The first and second seed layers 121 and 122 may include a fourth doping concentration of impurities.

The impurities may include at least one of first impurity and second impurity. For example, the first impurity may be germanium (Ge) (e.g., to form SiGe) and the second impurity may be boron (B) when forming a PMOS transistor. The first impurity may be carbon (C) (e.g., to form SiC) and the second impurity may be phosphorus (P) or arsenic (As) when forming an NMOS transistor. The first and second seed layers 121 and 122 may be formed by an epitaxial process.

Figure 23:
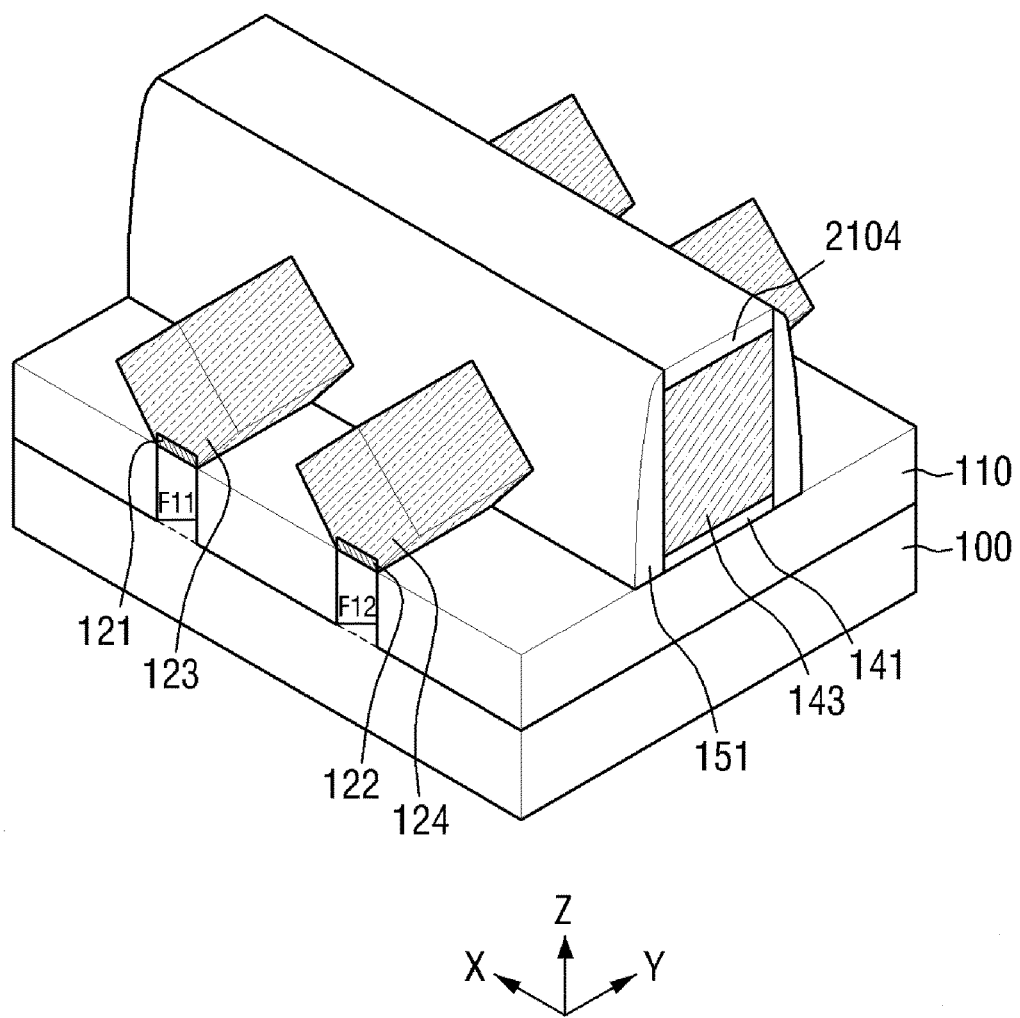

Referring to FIG. 23, the first elevated doped region 123 may be formed on the first fin F11 and the second elevated doped region 124 may be formed on the second fin F12. In detail, in the recess 199, the first elevated doped region 123 is formed on the first seed layer 121 and the second elevated doped region 124 is formed on the second seed layer 122.

The first and second elevated doped regions 123 and 124 may be formed by an epitaxial process. In addition, the first and second elevated doped regions 123 and 124 may be formed at a first pressure. The first pressure may be lower than a pressure applied when the first and second seed layers 121 and 122 are formed. For example, the first and second elevated doped regions 123 and 124 may be formed at 30 torr or less.

The first and second elevated doped regions 123 and 124 may include a first doping concentration of impurities. The first doping concentration may be equal to or greater than the fourth doping concentration.

The first and second elevated doped regions 123 and 124 may have a cross sectional shape of a diamond, a pentagon, a hexagon, a circle and/or a rectangle. The first elevated doped region 123 and the second elevated doped region 124 exemplified in FIG. 23 have a diamond shaped cross section.

Figure 24:
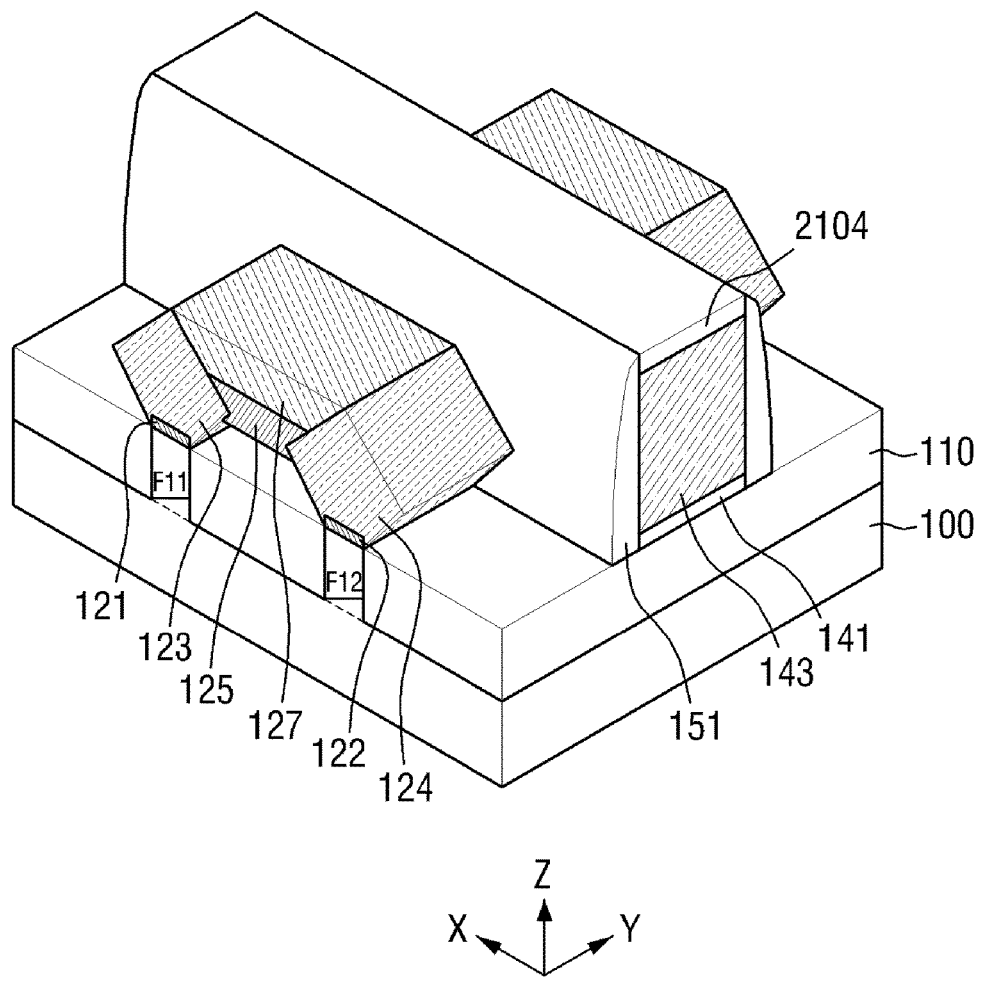

Referring to FIG. 24, the first bridge 125 is formed between the first and second elevated doped regions 123 and 124. The first bridge 125 may be formed by an epitaxial process. In detail, the first bridge 125 may connect the first elevated doped region 123 and the second elevated doped region 124 to each other. A second bridge may be formed on the first bridge with different process conditions. The second bridge may be formed at a faster rate than the first bridge. In this example, the bridge connecting the first and second elevated doped regions 123 and 124 is formed of a first and second bridge, but use of a single bridge (e.g., having the same doping concentration or a continuous gradient of or change in doping concentration) or more than two bridges may be formed. The first and second bridges 125, 127 may be grown in the same process chamber as the elevated doped regions 123, 124 are formed. The formation of the bridges 125, 127 and the elevated doped regions 123, 124 may occur without a vacuum break in the process chamber in which they are formed. For example, a continuous epitaxial process may be performed in a process chamber to epitaxially grow elevated doped regions 123, 124 under a first set of conditions and, without a vacuum break in the process chamber, epitaxially grow the bridges 125, 127 between adjacent elevated doped regions under a second set of process conditions. The semiconductor device may not be exposed to the atmosphere during the processes described above with respect to FIGS. 23 and 24.

A space between the first bridge 125 and the isolation layer 110 may be empty, and a first capping layer (129 of FIG. 25) and a first interlayer dielectric layer (171 of FIG. 26) may later be formed in this empty space.

The first and second elevated doped regions 123 and 124, the first bridge 125 may be formed at the first pressure and may include a second doping concentration of impurities. The second doping concentration may be different from the first doping concentration and may be higher than the first doping concentration. If the impurities include the first impurity (e.g., Ge), the second doping concentration may be $2.5*10^{22}$ atom/cc or greater, and if the impurities include the second impurity (e.g., B), the second doping concentration may be $1*10^{20}$ atom/cc or greater.

At the first pressure, epitaxial growth may not occur on surfaces of the first and second elevated doped regions 123 and 124. However, since a distance between the first and second elevated doped regions 123 and 124 is relatively short, the first bridge 125 may be piled up and formed between the first and second elevated doped regions 123 and 124. In addition, since the first bridge 125 has the second doping concentration, it can be more easily formed than the first and second elevated doped regions 123 and 124 having the first doping concentration. As the doping concentration of impurities increases, an epitaxial growth rate may be increased.

Next, a second bridge 127 is formed on the first bridge 125. The second bridge 127 may be formed by an epitaxial process. In detail, the second bridge 127 is connected to the first and second elevated doped regions 123 and 124 and the first bridge 125. The second bridge 127 may fill the empty space between the first and second elevated doped regions 123 and 124 on the first bridge 125. The second bridge 127 may include a third doping concentration of impurities and may be formed at a first pressure. The third doping concentration is equal to the first doping concentration.

At the first pressure, epitaxial growth may not occur on surfaces of the first and second elevated doped regions 123 and 124. The first bridge 125 may serve as a seed of the second bridge 127. Therefore, the second bridge 127 may fill the space between the first and second elevated doped regions 123 and 124 on the first bridge 125 using the first bridge 125 as a seed.

Figure 25:
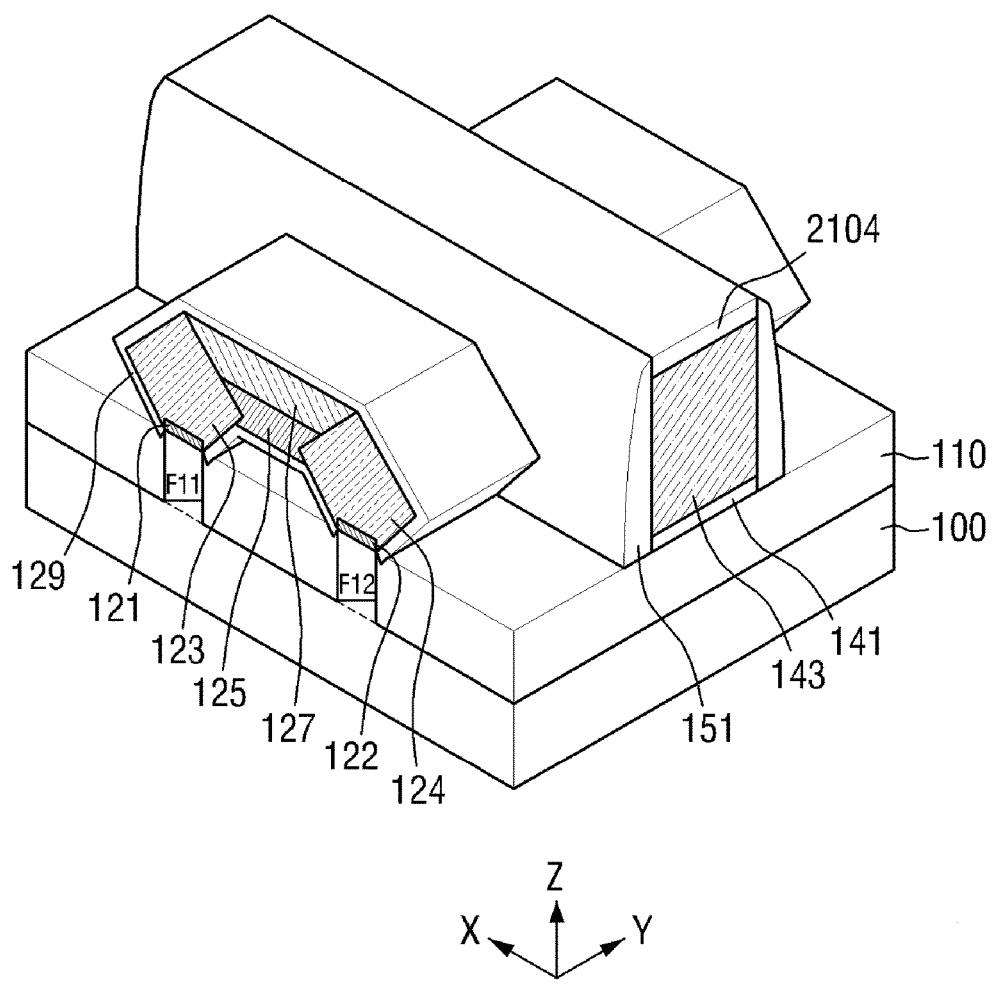

Referring to FIG. 25, the first capping layer 129 is formed. In detail, the first capping layer 129 may be formed to surround the first and second elevated doped regions 123 and 124 and the first and second bridges 125 and 127. Therefore, the first capping layer 129 may be disposed on the sidewalls of the first and second elevated doped regions 123 and 124, the bottom surface of the first bridge 125 and the top surface of the second bridge 127.

The first capping layer 129 may be formed by an epitaxial process. Since the first capping layer 129 is formed at a second pressure higher than the first pressure, it may be formed on surfaces of the first and second elevated doped regions 123 and 124 and the first and second bridges 125 and 127. The second pressure may be, for example, 50 torr or greater.

The first capping layer 129 may not include impurities. In such a case, an etch rate is relatively small, compared to a case where the first capping layer 129 includes impurities. Thus, the first and second elevated doped regions 123 and 124 and the second bridge 127 may be etched in reduced amounts when the contact 181 is formed.

Figure 26:
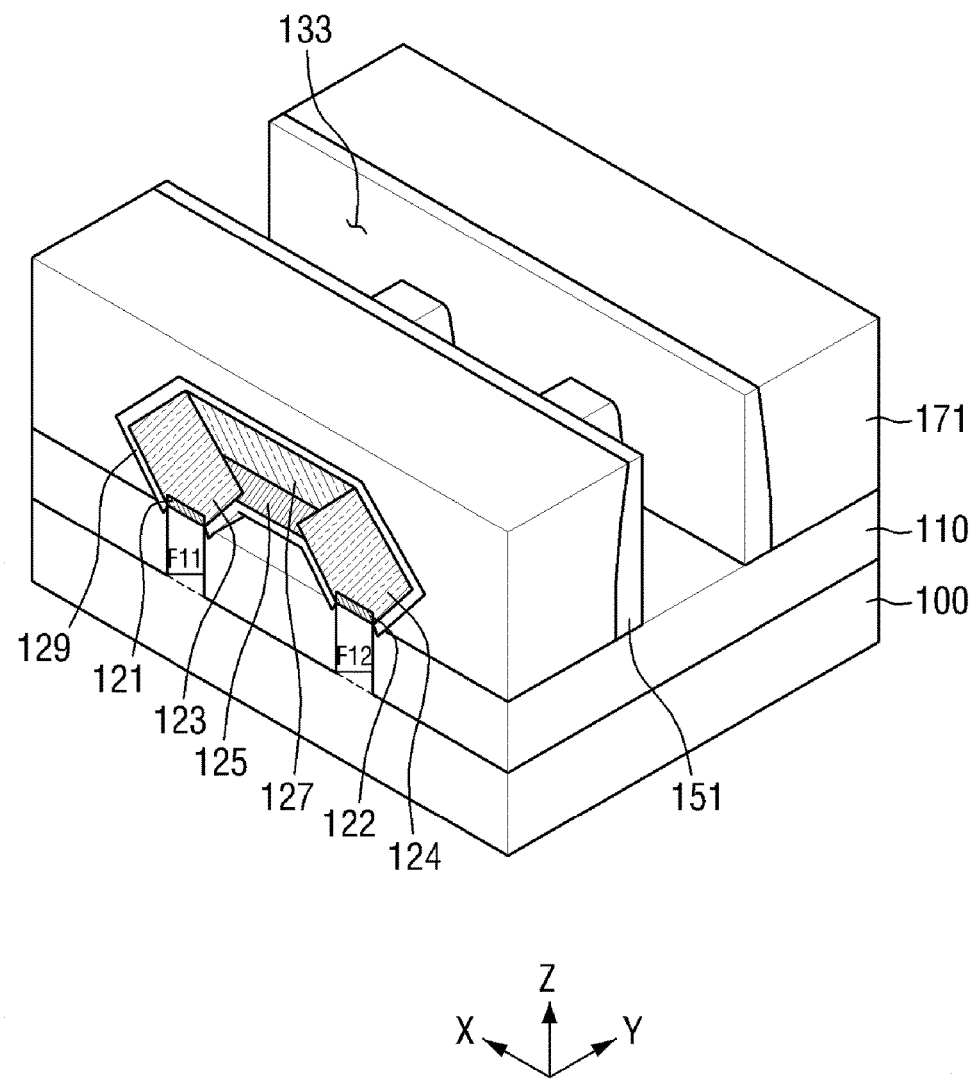

Referring to FIG. 26, the first interlayer dielectric layer 171 is formed on the resultant product shown in FIG. 25. The first interlayer dielectric layer 171 may include, for example, at least one of an oxide film, a nitride film and an oxynitride film.

Next, the first interlayer dielectric layer 171 is planarized until the top surface of the first dummy gate electrode 143 is exposed. As the result, the mask pattern 2104 is removed to then expose the top surface of the first dummy gate electrode 143.

Next, the first dummy gate insulation layer 141 and the first dummy gate electrode 143 are removed. As the first dummy gate insulation layer 141 and the first dummy gate electrode 143 are removed, a trench 133 is formed exposing the isolation layer 110 and portions of fins F11 and F12 within trench 133.

Figure 27:
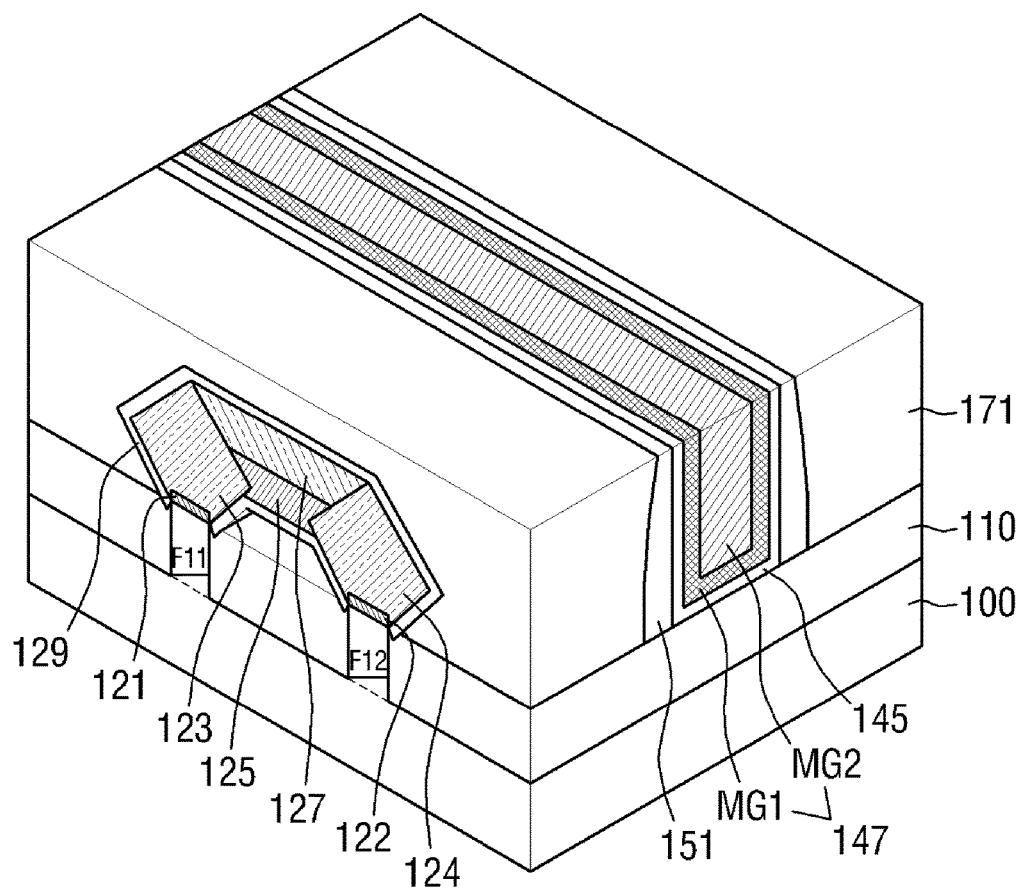

Referring to FIG. 27, the first gate insulation layer 145 and the first gate electrode 147 are formed in the trench 133.

The first gate insulation layer 145 may include a high-k material having a higher dielectric constant than a silicon oxide film. The high-k dielectric preferably may have a dielectric constant of 6 or greater. Alternatively, the high-k dielectric may have a dielectric constant of 8 or greater, larger than 10. For example, the first gate insulation layer 145 may include $HfO_2$, $ZrO_2$, LaO, $Al_2O_3$ or $Ta_2O_5$. The first gate insulation layer 145 may be substantially conformally formed on the sidewalls and bottom surface of the trench 133.

The first gate electrode 147 may include metal layers MG1 and MG2. As shown, the first gate electrode 147 may include two or more metal layers MG1 and MG2 stacked one on another. The first metal layer MG1 may control a work function, and the second metal layer MG2 may fill a remaining space defined by the first metal layer MG1 within trench 133. For example, the first metal layer MG1 may include at least one of TiN, TaN, TiC, and TaC. In addition, the second metal layer MG2 may include W or Al. Further, the first gate electrode 147 may be made of conductive (or doped) Si or SiGe, instead of a metal. The gate insulation layer 145, metal layer MG1 and metal layer MG2 may be sequentially deposited to blanket the structure illustrated in FIG. 26, and a planarization etch (e.g., chemical mechanical polishing) may be used to remove the portions of these layers on the surfaces of first interlayer dielectric layer 171 not within trench 133.

Figure 28:
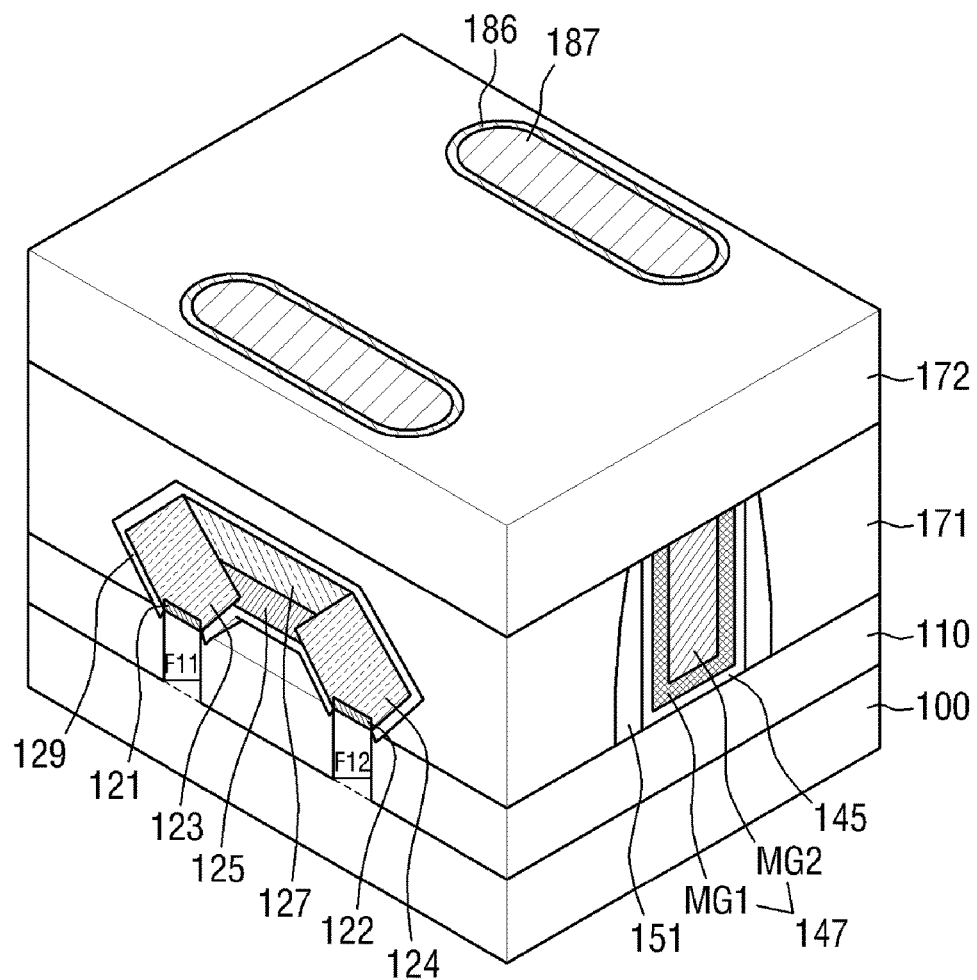

Referring to FIGS. 1, 3 and 28, the second interlayer dielectric layer 172 is formed on the resultant product shown in FIG. 27. The second interlayer dielectric layer 172 may include, for example, at least one of a silicon oxide film, a silicon nitride film and a silicon oxynitride film.

Next, a first contact hole 181a is formed, the first contact hole 181a passing through the first interlayer dielectric layer 171 and the second interlayer dielectric layer 172 and exposing the first and second elevated doped regions 123 and 124 and the second bridge 127. When the first contact hole 181a exposing the first and second elevated doped regions 123 and 124 and the second bridge 127 is formed, the etched amounts of the first and second elevated doped regions 123 and 124 and the second bridge 127 may be reduced by the first capping layer 129 having a relatively low etch rate.

Next, a first contact 181 is formed to fill the first contact hole 181a. The first contact 181 may include a first silicide layer 183 formed on a bottom surface of the first contact hole 181a, a first conductive layer 186 and a second conductive layer 187. The first conductive layer 186 may be conformally formed along sidewalls of the first contact hole 181a and a top surface of the first silicide layer 183, and the second conductive layer 187 may be formed on the first conductive layer 186 to fill the contact hole 181a. The first silicide layer 183 may be formed by depositing a metal and to react with the semiconductor material of the elevated doped regions 123 and 124 via a heating process to form a silicide (or other compound of the metal with the semiconductor). The second conductive layer 187 may be deposited in the remaining portion of the contact hole 181a, and a planarization etching process to remove portions of 183 metal and second conductive layer outside the contact hole 181a to expose a surface of the second interlayer dielectric layer 172.

The first silicide layer 183 may include, for example, a conductive material, such as Pt, Ni, or Co, but aspects of the present invention are not limited thereto.

The conductive layer 185 may include a conductive material. For example, the first conductive layer 186 may include Ti or TiN and the second conductive layer 187 may include W, Al or Cu, but aspects of the present invention are not limited thereto.

A method of fabricating a semiconductor device according to a fourth embodiment of the present invention will now be described with reference to FIGS. 11A, 12A and 29 to 37A and 37B.

FIGS. 29 to 37A and 37B are cross-sectional views sequentially illustrating intermediate stages in a method of fabricating a semiconductor device according to embodiments of the present invention. The method may be used to manufacture the devices shown in FIGS. 11A and 11B as well as alternatives described herein. For the sake of convenient explanation, the following description will focus on differences between the first and fourth embodiments of the present invention.

Figure 29:
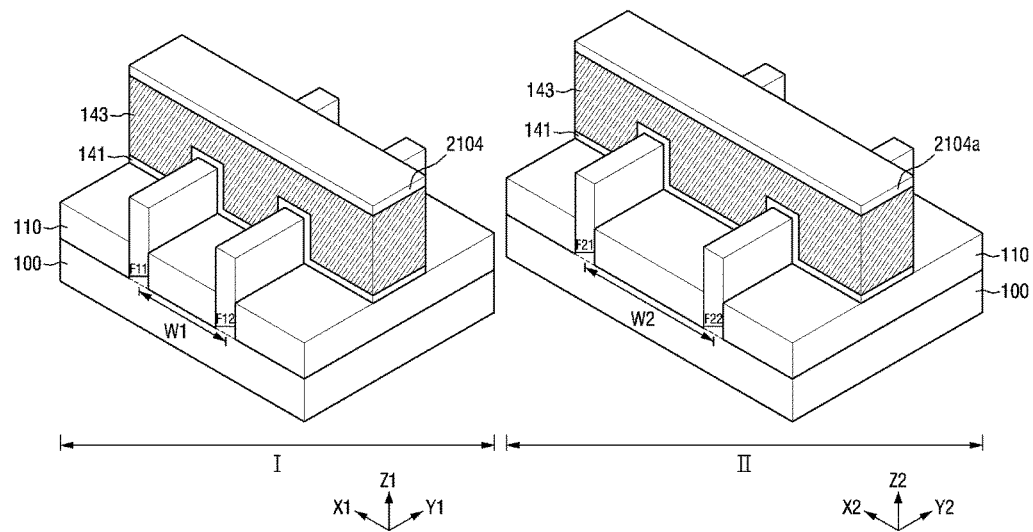

Referring to FIG. 29, a first region I and a second region II are defined in the substrate 100. The first region I may be a logic region and the second region II may be an SRAM region, but aspects of the present invention are not limited thereto. The first region I may be a logic region and the second region II may be a region where other types of memories (for example, DRAM, MRAM, RRAM, PRAM, etc.) are to be formed.

In the first region I, the first and second fins F11 and F12 is formed, extending side by side in the Y2 direction, and the first dummy gate electrode 143 is formed, extending in the X1 direction to overlap the first and second fins F11 and F12. The first dummy gate insulation layer 141 may be formed under the first dummy gate electrode 143 and a mask pattern 2104 may be formed on the first dummy gate electrode 143.

In the second region II, the third and fourth fins F21 and F22 is formed, extending side by side in the Y2 direction, and the first dummy gate electrode 243 is formed to overlap the third and fourth fins F21 and F22. The first dummy gate insulation layer 141 may be formed under the first dummy gate electrode 143 and the mask pattern 2104 may be formed on the first dummy gate electrode 143.

A pitch distance W11 between the first fin F11 and the second fin F12 is shorter than a pitch distance W12 between the third and fourth fins F21 and F22. The magnitude of these distances W11 and W12 determine whether or not a bridge will be formed.

Figure 30:
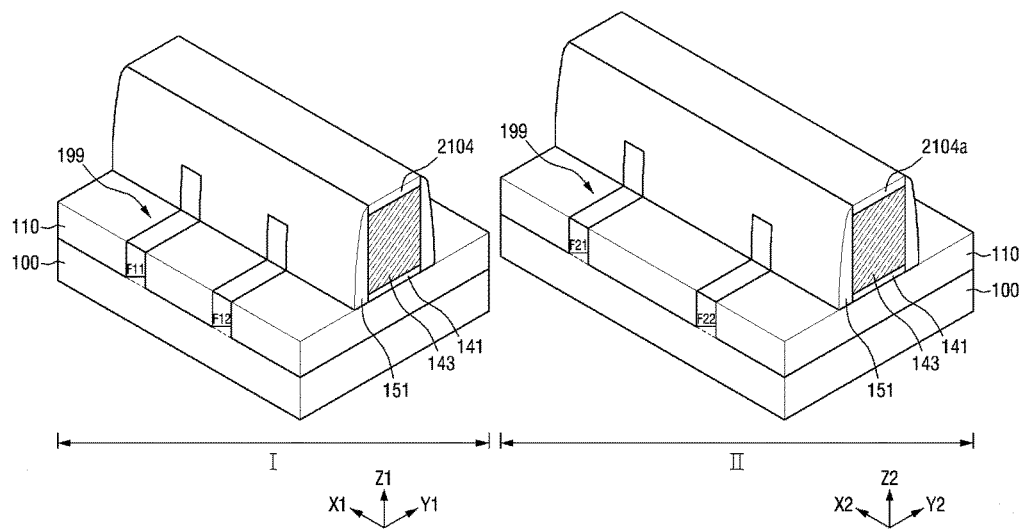

Referring to FIG. 30, the first spacer 151 is formed on sidewalls of the first dummy gate electrode 143 in the first and second regions I and II.

Next, portions of the first to fourth fins F11, F12, F21 and F22 exposed at both sides of the first dummy gate electrode 143 are removed, thereby forming recesses 199 in first to fourth fins F11, F12, F21 and F22 on either side of the respective dummy gate 2104.

Figure 31:
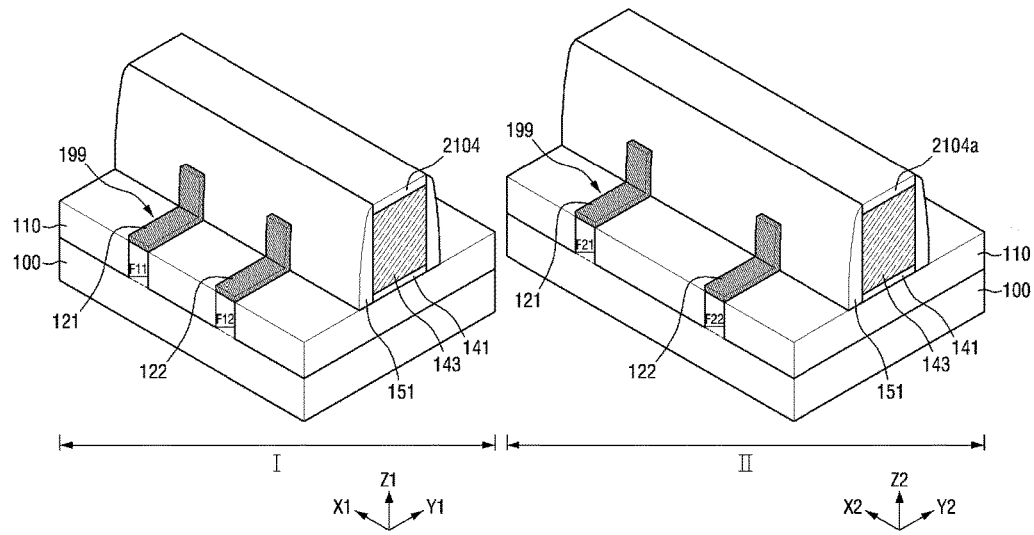

Referring to FIG. 31, the first to fourth seed layers 121, 122, 21 and 22 are formed on fins F11, F12, F21 and F22 at the corresponding recesses 199. In detail, the first seed layer 121 is formed along the surface of the first fin F11, the second seed layer 122 is formed along the surface of the second fin F12, the third seed layer 21 is formed along the surface of the third fin F21, and the fourth seed layer 22 is formed along the surface of the fourth fin F22. The first to fourth seed layers 121, 122, 21 and 22 may be formed by an epitaxial process.

Figure 32:
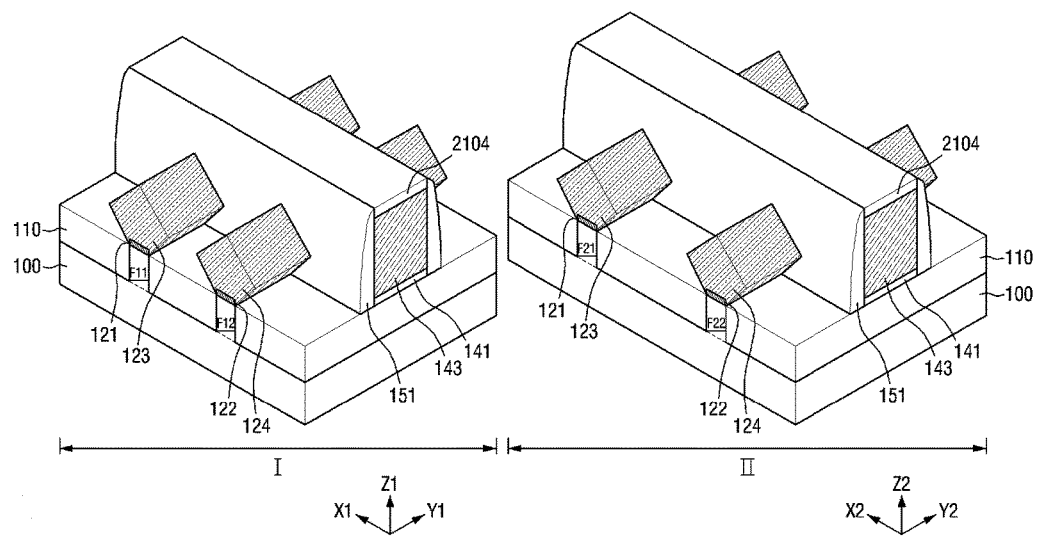

Referring to FIG. 32, the first to fourth elevated doped regions 123, 124, 23 and 24 are formed on the first to fourth fins F11, F12, F21 and F22, respectively. The first to fourth elevated doped regions 123, 124, 23 and 24 may be formed by an epitaxial process using the first to fourth seed layers 121, 122, 21 and 22 as seeds. The first to fourth elevated doped regions 123, 124, 23 and 24 may be formed at the first pressure lower than a pressure at which the first to fourth seed layers 121, 122, 21 and 22 are formed.

The first to fourth elevated doped regions 123, 124, 23 and 24 may include impurities in the first doping concentration. Here, the impurities may include a first impurity and a second impurity. For example, when forming a PMOS finfet, the first impurity may be germanium (Ge) and the second impurity may be boron (B). When forming an NMOS finfet, the first impurity may be carbon (C) and the second impurity may be phosphorus (P) or arsenic (As).

Figure 33:
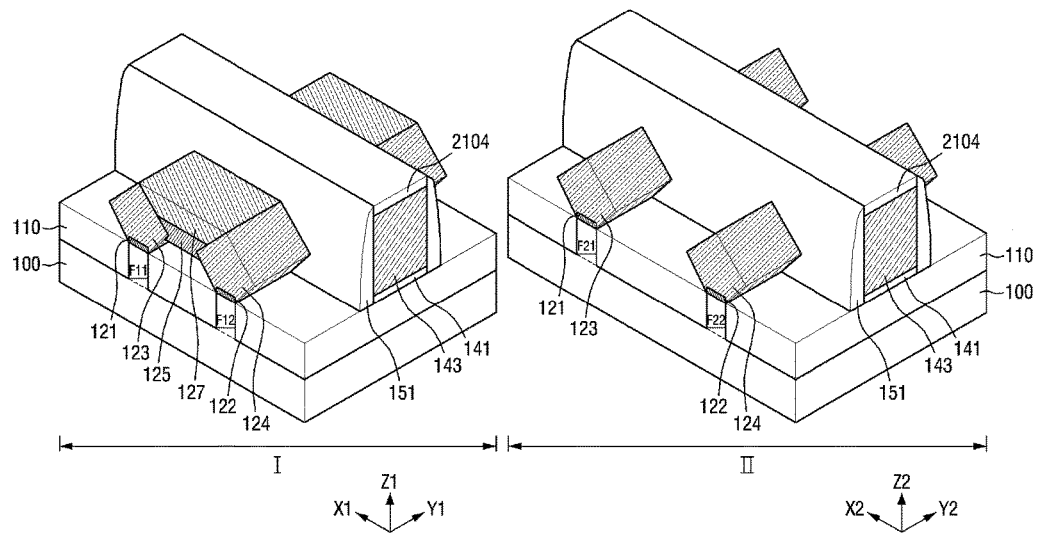

Referring to FIG. 33, the first bridge 125 is formed in first region I. The first bridge 125 connects the first and second elevated doped regions 123 and 124 to each other. The first bridge 125 may be formed at the first pressure by the epitaxial process and may comprise impurities having the second doping concentration. The second doping concentration may be higher than the first doping concentration. If the impurities include first impurity, the second doping concentration may be $2.5*10^{22}$ atom/cc or greater, and if the impurities include second impurity, the second doping concentration may be $1*10^{20}$ atom/cc or greater. The first bridge 125 is not formed in the second region II.

At the first pressure that is relatively low, epitaxial growth may not occur on surfaces of the first and second elevated doped regions 123 and 124. However, in the first region I, the pitch distance W11 between the first and second fins F11 and F12 is relatively small, so that the distance between the first and second elevated doped regions 123 and 124 is relatively small. Further, the first and second elevated doped regions 123 and 124 may make contact with each other (such as described with respect to the embodiment of FIG. 9). Therefore, the first bridge 125 may be piled up and formed between the first and second elevated doped regions 123 and 124 to connect the first and second elevated doped regions 123 and 124 to each other. In addition, since the first bridge 125 has the second doping concentration, it can be more easily formed than the first and second elevated doped regions 123 and 124 having the first doping concentration.

The pitch distance W12 between the third and fourth fins F21 and F22 is longer than the pitch distance W11 between the first and second fins F11 and F12. As the distance between the third and fourth elevated doped regions 23 and 24 is relatively large, the first bridge 125 may not be formed. While the first bridge 125 is formed in the first region I, no significant change occurs in the second region I.

Even if the epitaxial process to form the first bridge is performed on the first region I and the second region II at the same time (e.g., with all of first through fourth elevated regions exposed to the process, such as exposed to the precursor for epitaxial growth), the first bridge 125 may be formed only on the first region I between the first and second elevated doped regions 123 and 124.

Next, the second bridge 127 is formed on the first bridge 125. The second bridge 127 may include impurities in a third doping concentration. The second bridge 127 may be formed at the first pressure by an epitaxial process. The third doping concentration may be equal to the first doping concentration. The second bridge 127 may be formed on the first bridge 125 using the first bridge 125 as a seed and may fill a space between the first and second elevated doped regions 123 and 124. Since the epitaxial process is performed at the first pressure, epitaxial growth does not occur on surfaces of the first to fourth elevated doped regions 123, 124, 23 and 24. However, since the first bridge 125 includes impurities in the second doping concentration, it can be formed on the first bridge 125 by epitaxial growth to then form the second bridge 127. While the second bridge 127 is formed, no significant change occurs in the second region II.

Figure 34:
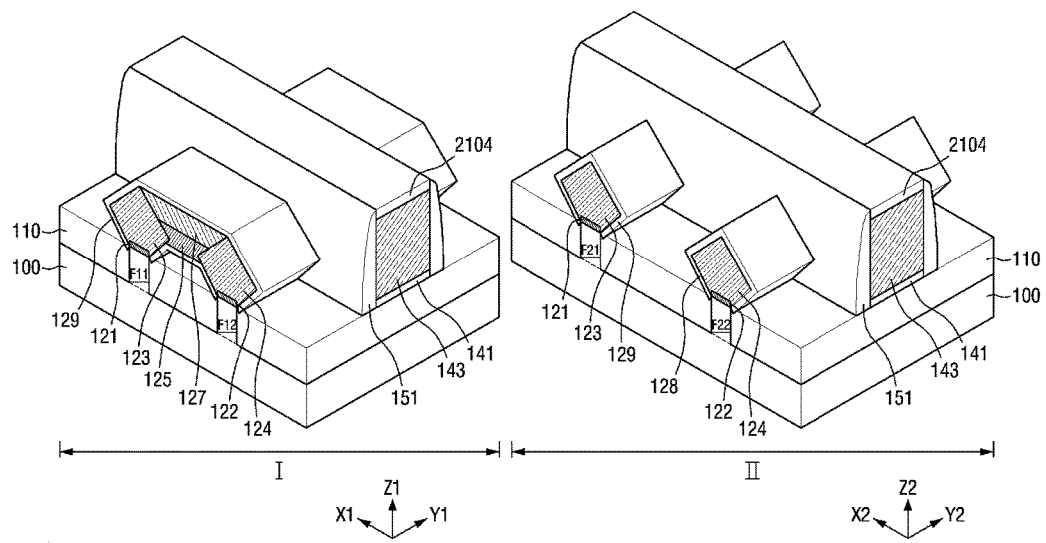

Referring to FIG. 34, capping layers 129, 29 and 28 are formed. In detail, in the first region I, a first capping layer 129 is disposed on the sidewalls of the first and second elevated doped regions 123 and 124, the bottom surface of the first bridge 125 and the top surface of the second bridge 127. In the second region II, a second capping layer 29 surrounding the third elevated doped region 23, and a third capping layer 28 surrounding the fourth elevated doped region 24 are formed. The first to third capping layers 129, 29 and 28 may be simultaneously formed.

The capping layers 129, 29 and 28 may be formed by epitaxially growing undoped semiconductor, such as silicon and not include impurities. Since the capping layers 129, 29 and 28 are formed at a second pressure higher than the first pressure, they may epitaxially grow on surfaces of the first to fourth elevated doped regions 123, 124, 23 and 24 and the first and second bridges 125 and 127. The second pressure may be, for example, 50 torr or greater.

Figure 35:
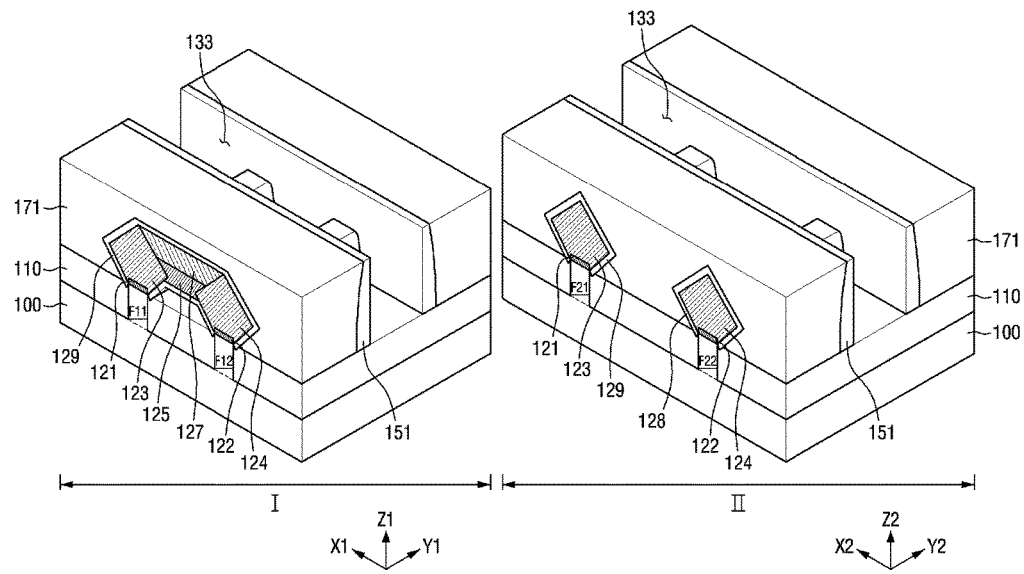

Referring to FIG. 35, a first interlayer dielectric layer 171 is formed on the resultant product shown in FIG. 34. The first interlayer dielectric layer 171 may be deposited to cover the capping layers 129, 29 and 28. The first interlayer dielectric layer 171 may be blanket deposited on both the first region I and the second region II. The first interlayer dielectric layer 171 may include, for example, at least one of a silicon oxide film, a silicon nitride film and a silicon oxynitride film.

Next, the first interlayer dielectric layer 171 is planarized until the top surface of the first dummy gate electrode 143 is exposed. As the result, the mask pattern 2104 is removed to then expose the top surface of the first dummy gate electrode 143.

Next, the first dummy gate insulation layer 141 and the first dummy gate electrode 143 are removed via an etching process. As the first dummy gate insulation layer 141 and the first dummy gate electrode 143 are removed, a trench 133 exposing the isolation layer 110 is formed.

Figure 36:
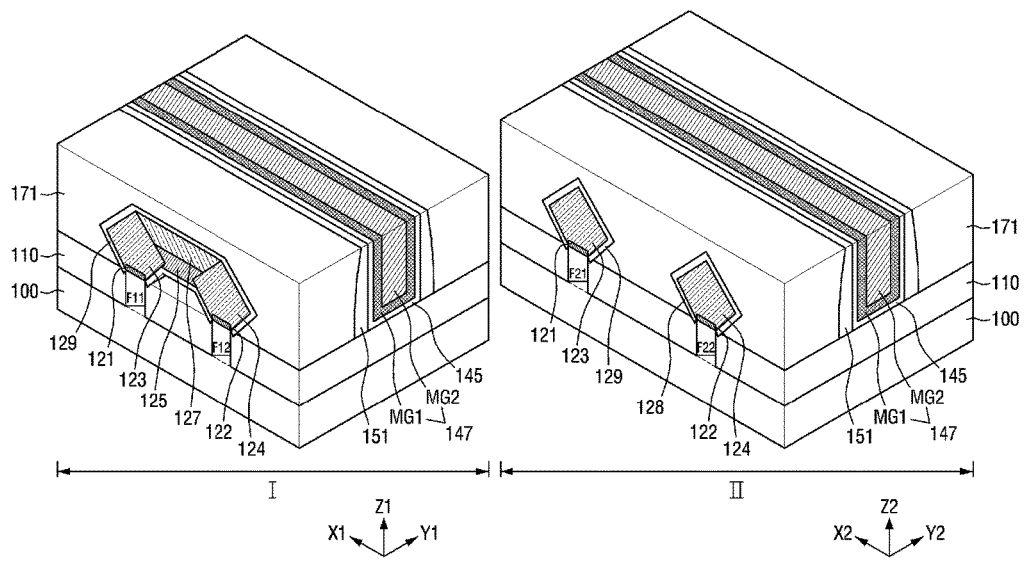

Referring to FIG. 36, in the first and second regions I and II, a first gate insulation layer 145 and a first gate electrode 147 are formed in the trench 133. The first gate electrode 147 may include metal layers MG1 and MG2. Here, the first metal layer MG1 may control a work function of a p type fin transistor.

Figure 37A:
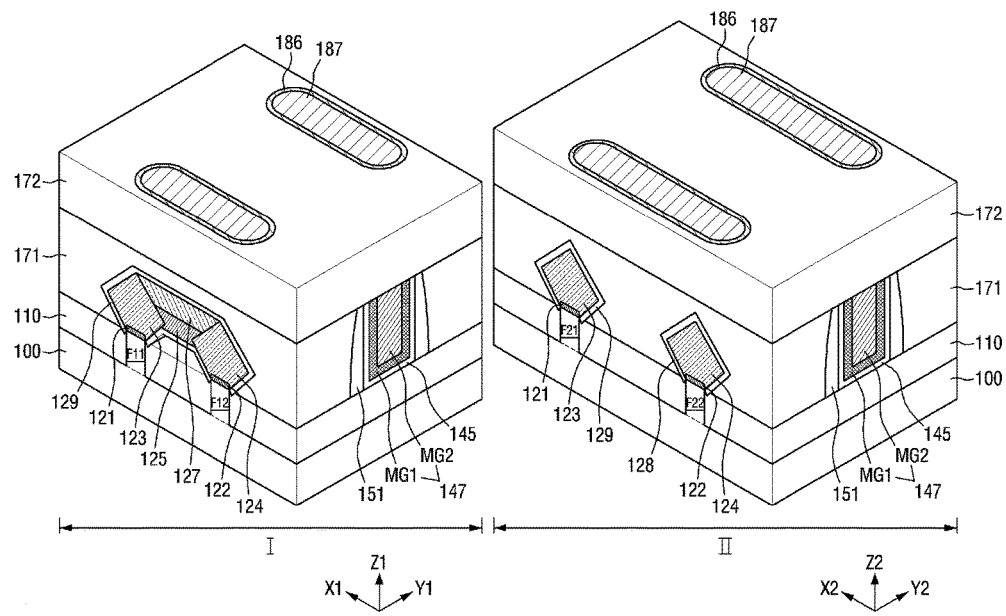

Referring to FIG. 37A, a second interlayer dielectric layer 172 is formed on the resultant product shown in FIG. 36. The second interlayer dielectric layer 172 may include, for example, at least one of a silicon oxide film, a silicon nitride film and a silicon oxynitride film.

Next, first contact holes 181a are formed in the first and second regions I and II passing through the first interlayer dielectric layer 171 and the second interlayer dielectric layer 172. First contact holes 181a in the first region I expose the first and second elevated doped regions 123 and 124 and the second bridge 127, and first contact holes 181a in the second region II expose the third and fourth elevated doped regions 23 and 24. In the embodiment shown in FIG. 37A, the each of the first contact holes 181a expose both of the third and fourth elevated regions 23 and 24 to thus later form a contact connecting to both the third and fourth elevated doped regions 23 and 24. However, in an alternative embodiment, the contact holes 181a may expose just one of the third and fourth elevated doped regions 23 and 24. For example, in the structure shown in the second region II of FIG. 37A, four contact holes 181a may be formed, each of which expose a single elevated doped region. When the first contact hole 181a is formed, the etched amounts of the first to fourth elevated doped regions 123, 124, 23 and 24 may be reduced by the first to third capping layers 129, 29 and 28.

Next, a first contact 181 is formed to fill the first contact hole 181a. The first contact 181 may include a first silicide layer 183 formed on a bottom surface of the first contact hole 181a, a first conductive layer 186 and a second conductive layer 187. The first conductive layer 186 may be conformally formed along sidewalls of the first contact hole 181a and a top surface of the first silicide layer 183, and the second conductive layer 187 may be formed on the first conductive layer 186 to fill the contact hole 181a.

Figure 37B:
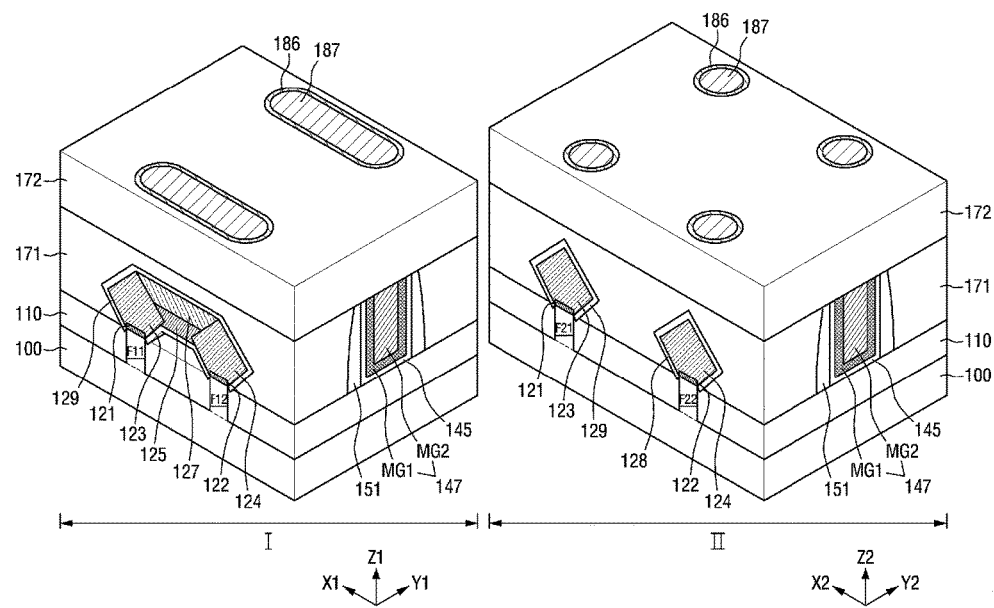

The resulting structure may be the same as that described with respect to FIGS. 11A and 13A. Modifications and alternatives described herein may also be manufactured accordingly. For example, as described with respect to previous embodiments, the contact in the second region II may not be shared with plural S/D regions and may instead be replaced by two separate contacts (that may comprise separate electrical nodes) each of which individually contacting one of the S/D regions. An example of this modification is shown in FIG. 37B where each of the source/drains are in contact with a dedicated contact (e.g., having a one-to-one relationship). The first gate structure 149 of the second region II and the first gate structure 149 in the first region I may be elements of the same gate line (e.g., forming portions of the same electrical node) or may be elements of different gate lines (e.g., elements of different electrical nodes). In such an alternative, two separate transistors may be formed by the structure in region II in 37B. In addition, second gate structure 149 in the second region II may be replaced by two separate gate structures (e.g., not being electrically connected or forming separate electrical nodes), each dedicated to one of fins F21 and F22 (e.g., the gate structure 147 may be formed with a discontinuity between fins F21 and F22).

Figure 38:
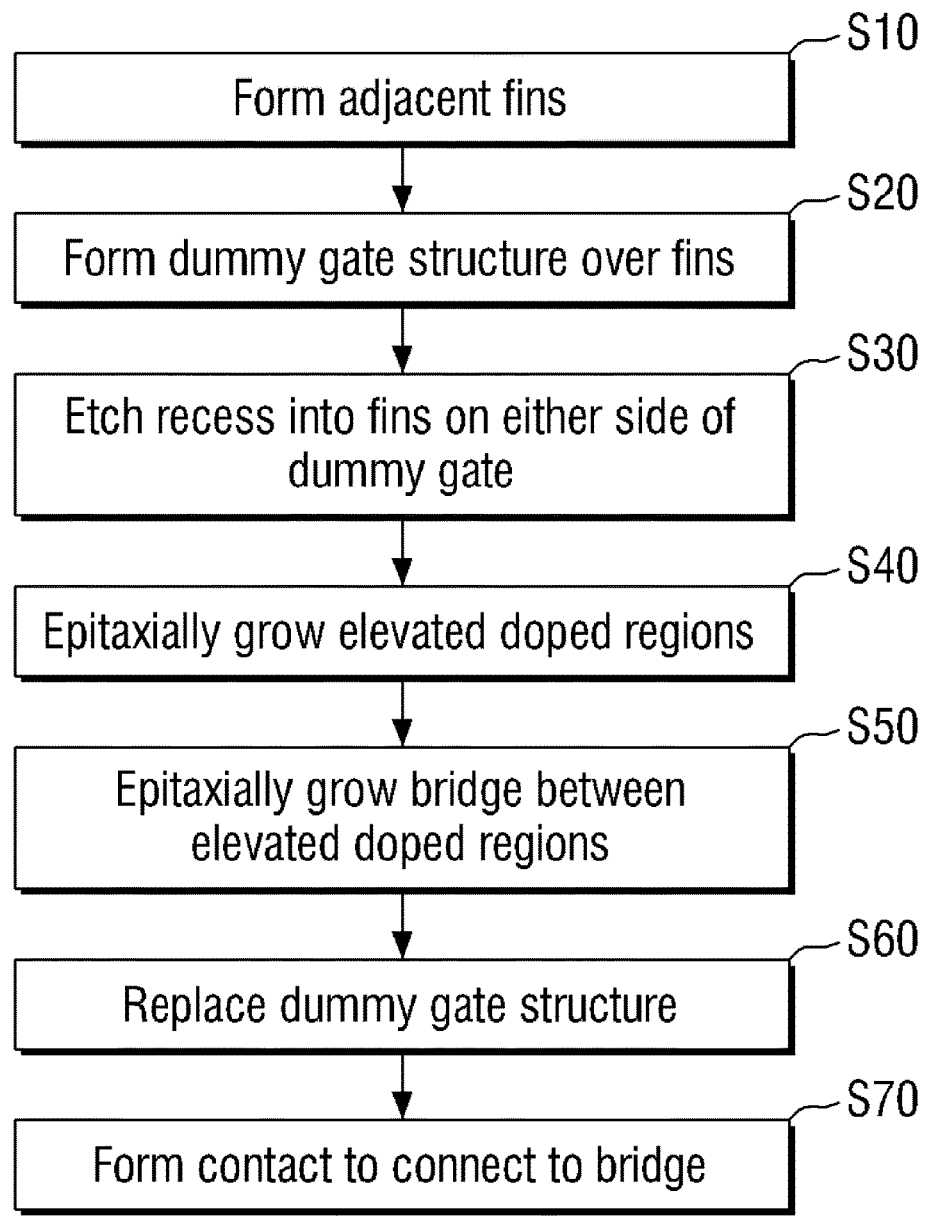
FIG. 38 is a flowchart of a series of steps that may be used to manufacture the semiconductor devices described herein or related thereto.

FIG. 38 is a flow chart of a series of steps that may be used to manufacture the semiconductor devices described herein. The process described with respect to FIG. 38 may be implemented by methods described herein. In step S10, adjacent semiconductor fins are formed (e.g., fins F11 and F12) of FIG. 1. The fins may be etched from a semiconductor wafer or epitaxially grown from a substrate. The fins may be formed of a crystalline semiconductor material, such as crystalline silicon.

In step S20, a dummy gate structure (e.g., a dummy gate and a dummy gate oxide) is formed to extend over the adjacent fins. The dummy gate structure may extend on sidewall surfaces and top surfaces of the adjacent fins. The dummy gate structure will eventually be replaced by a real gate structure. Use of such a dummy gate is optional.

In step S30, recesses are etched into both fins on either side of the dummy gate structure. Step S30 is optional in both the method. That is, when no recess is etched into the fins, semiconductor devices may include elevated doped regions extending from the original fin structure (such alternative contemplated for all embodiments described herein). In step S40, the elevated doped regions are grown. In this example, the elevated doped regions are grown at locations corresponding to the recesses etched into the fins. The elevated doped regions may correspond to the elevated doped regions described herein with respect to other embodiments.

In step S50, a bridge is grown between adjacent elevated doped regions. The bridge may comprise one or both of a first bridge and a second bridge described herein, such one or both of 25 or 27 (or one or both of 125, 127). The bridge may be grown in the same process chamber as the elevated doped regions are formed. The formation of the bridge and the elevated doped regions may occur without a vacuum break in the chamber in which they are formed. For example, a continuous epitaxial process may be performed in a process chamber to epitaxially grow elevated doped regions under a first set of conditions and, without a vacuum break in the process chamber, epitaxially grow the bridge between adjacent elevated doped regions under a second set of process conditions. The semiconductor device may not be exposed to the atmosphere between steps S40 and S50. In addition, a capping layer (such as those described herein) may be epitaxially grown on the elevated doped regions and bridge(s) in the same process chamber as part of the same continuous epitaxial process (e.g., without a vacuum break) as that used for growth of the elevated doped regions and the bridge(s).

In step S60, the dummy gate structure is removed and replaced with a real dummy gate structure, such as a high-k dielectric gate insulator and one or more gate metals placed on the high-k dielectric gate insulator.

In step S70, a contact is formed (e.g., through a interlayer dielectric) to contact the bridge. The remainder of the semiconductor device (e.g., a semiconductor integrated circuit chip) may then be formed.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, while several of the embodiments illustrate two regions associated with various structure, it is contemplated that embodiments may include more than just the structure associated with two regions (e.g., devices may be formed with structure associated in one or more of regions I, II, III and IV). In addition, embodiments describing source/drains (e.g., 120) with a bridge between elevated doped regions (e.g., a first bridge 125, and a second bridge 127) are described with respect to a multi-gate transistor with shared gate structure 149 and both source/drains having a bridge. However, the invention is not limited thereto. Separate gate structures 149 may be formed on the parallel neighboring fins (e.g., fin F11 and fin F12 may have a separate gate structure, such as gate structure 149 with a discontinuity at a location between fins F11 and F12). In addition, both sides of the gate structure need not connected elevated doped regions of the fins together. Thus, separate transistors may be formed with one the source/drain pairs having a shared contact connecting to a bridge formed between the elevated doped regions of the neighboring fins (with a shared gate structure or with separate gate structures). Similarly, devices described with respect to regions II and IV (e.g., with respect to FIGS. 11B and 13B) may have one set of neighboring source/drains connected to a shared contact (with our without use of a bridge, such as 125 and/or 127) and another set of neighboring source drains having separate contacts. It is therefore desired that the present embodiments be considered in all respects as illustrative and not restrictive, reference being made to the appended claims rather than the foregoing description to indicate the scope of the invention.

What is claimed is:

1. A semiconductor device comprising:
   a semiconductor substrate with a first semiconductor fin with a first protrusion and a second semiconductor fin with a second protrusion, the first semiconductor fin being adjacent the second semiconductor fin, the first and second semiconductor fins extending in a first direction;
   a gate electrode extending in a second direction and positioned over the first protrusion of the first semiconductor fin and over the second protrusion of the second semiconductor fin;
   a first source/drain adjacent the first protrusion and extending from the first semiconductor fin, an upper oblique surface of the first source/drain and a lower oblique surface of the first source/drain meeting at a first corner of the first source/drain;
a second source/drain adjacent the second protrusion and extending from the second semiconductor fin, an upper oblique surface of the second source/drain and a lower oblique surface of the second source/drain meeting at a second corner of the second source/drain,
a semiconductor bridge extending between and contacting the first corner of the first source/drain and the second corner of the second source/drain,
wherein the semiconductor bridge includes a first portion at the first corner and the second corner and a second portion on the first portion extending between and contacting the upper oblique surface of the first source/drain and the upper oblique surface of the second source/drain, and
wherein the upper oblique surface of the first source/drain intersects the upper oblique surface of the second source/drain.

2. The semiconductor device of claim 1, wherein the first portion of the semiconductor bridge is located at the intersection of the upper oblique surfaces of the first and second source drains.

3. The semiconductor device off claim 2,
wherein the lower oblique surface of the first source/drain intersects the lower oblique surface of the second source/drain, and
wherein the semiconductor device further comprises a capping layer on the lower oblique surfaces of the first and second drains, extending to the intersection of the lower oblique surfaces.

4. A semiconductor device comprising:
a semiconductor substrate with a first semiconductor fin with a first protrusion and a second semiconductor fin with a second protrusion, the first semiconductor fin being adjacent the second semiconductor fin, the first and second semiconductor fins extending in a first direction;
a gate electrode extending in a second direction and positioned over the first protrusion of the first semiconductor fin and over the second protrusion of the second semiconductor fin;
a first source/drain adjacent the first protrusion and extending from the first semiconductor fin, an upper oblique surface of the first source/drain and a lower oblique surface of the first source/drain meeting at a first corner of the first source/drain;
a second source/drain adjacent the second protrusion and extending from the second semiconductor fin, an upper oblique surface of the second source/drain and a lower oblique surface of the second source/drain meeting at a second corner of the second source/drain;
a semiconductor bridge extending between and contacting the first corner of the first source/drain and the second corner of the second source/drain;
a third semiconductor fin with a third protrusion and a fourth semiconductor fin with a fourth protrusion, the third semiconductor fin being adjacent the fourth semiconductor fin;
a second gate electrode extending over the third protrusion of the third semiconductor fin and over the fourth protrusion of the fourth semiconductor fin;
a third source/drain adjacent the third protrusion and extending from the third semiconductor fin, an upper oblique surface of the third source/drain and a lower oblique surface of the third source drain meeting at a third corner of the third source/drain;
a fourth source/drain adjacent the fourth protrusion and extending from the fourth semiconductor fin, an upper oblique surface of the fourth source/drain and a lower oblique surface of the fourth source drain meeting at a fourth corner of the fourth source/drain;
an interlayer dielectric layer disposed about the first and second source/drains and below the semiconductor bridge; and
a conductive contact extending through the interlayer dielectric, the conductive contact comprising a silicide layer contacting the semiconductor bridge at an upper surface of the semiconductor bridge.

5. The semiconductor device of claim 4, wherein a pitch distance between the first fin and the second fin is 48 nm or less.

6. The semiconductor device of claim 4,
wherein the first semiconductor fin, the second semiconductor fin, the first source/drain and the second source drain are located in a logic region of the semiconductor device, and
wherein the third semiconductor fin, the fourth semiconductor fin, the third source/drain and the fourth source/drain are located in a memory region of the semiconductor device.

7. The memory device of claim 6, wherein the memory region is an SRAM region.

8. A semiconductor device comprising:
a semiconductor substrate with a first semiconductor fin with a first protrusion and a second semiconductor fin with a second protrusion, the first semiconductor fin being adjacent the second semiconductor fin, the first and second semiconductor fins extending in a first direction;
a gate electrode extending in a second direction and positioned over the first protrusion of the first semiconductor fin and over the second protrusion of the second semiconductor fin;
a first source/drain adjacent the first protrusion and extending from the first semiconductor fin, an upper oblique surface of the first source/drain and a lower oblique surface of the first source/drain meeting at a first corner of the first source/drain;
a second source/drain adjacent the second protrusion and extending from the second semiconductor fin, an upper oblique surface of the second source/drain and a lower oblique surface of the second source/drain meeting at a second corner of the second source/drain;
a semiconductor bridge extending between and contacting the first corner of the first source/drain and the second corner of the second source/drain;
an interlayer dielectric layer disposed about the first and second source/drains and below the semiconductor bridge; and
a conductive contact extending through the interlayer dielectric, the conductive contact comprising a silicide layer contacting the semiconductor bridge at an upper surface of the semiconductor bridge.

9. The semiconductor device of claim 8,
wherein the first and second source/drains contact the first and second fins at a first height,
wherein, at the first height, the first fin and the second fin are separated from each other by a first distance,
wherein a minimum distance between the first source/drain and the second source/drain is between the first corner of the first source/drain and the second source/drain, the minimum distance being less than the first distance.

10. The semiconductor device of claim 8,
wherein the first and second source/drains contact the first and second fins at a first height,
wherein, at the first height, the first fin and the second fin are separated from each other by a first distance, and
wherein, with respect to a cross section taken in a direction perpendicular to the first direction, the width of the conductive contact is greater than the first distance.

11. The semiconductor device of claim 8, wherein, with respect to a cross section taken in a direction perpendicular to the first direction, the first and second source/drains have a diamond shape.

12. The semiconductor device of claim 8, further comprising an air gap in the interlayer dielectric at a location under the semiconductor bridge.

13. The semiconductor device of claim 8, wherein at least a portion of the semiconductor bridge has a doping concentration higher than a doping concentration of the first and second source/drains.

14. The semiconductor device of claim 8,
wherein the lower oblique surface of the first source/drain intersects the lower oblique surface of the second source/drain, and
wherein the semiconductor device further comprises a capping layer on the lower oblique surfaces of the first and second drains, extending to the intersection of the lower oblique surfaces.

15. The semiconductor device of claim 8, further comprising an epitaxial semiconductor capping layer formed on a bottom surface of the semiconductor bridge and above the interlayer dielectric.

16. The semiconductor device of claim 8, wherein the semiconductor bridge includes a first portion at the first corner and the second corner and a second portion on the first portion extending between and contacting the upper oblique surface of the first source/drain and the upper oblique surface of the second source/drain.

17. The semiconductor device of claim 16, wherein the second portion of the semiconductor bridge has a top surface at least as high as top surfaces of the first and second source/drains.

18. The semiconductor device of claim 16, wherein the first portion of the semiconductor bridge extends between and contacts the first corner and the second corner and extends between and contacts the lower oblique surfaces of the first and second source/drains.

19. The semiconductor device of claim 16, wherein a doping concentration of the first portion of the semiconductor bridge is higher than a doping concentration of the second portion of the semiconductor bridge.

20. The semiconductor device of claim 19, wherein a doping concentration of the first portion of the bridge is higher than a doping concentration of the first and second source/drains.

\* \* \* \* \*